US008115152B1

(12) United States Patent
Martin

(10) Patent No.: US 8,115,152 B1
(45) Date of Patent: Feb. 14, 2012

(54) METHOD OF OPERATING A PHOTOCONDUCTOR IN AN IMAGING SYSTEM, AND READ-OUT CIRCUIT EMPLOYING AN AC-BIASED PHOTOCONDUCTOR

(75) Inventor: Robert James Martin, Orlando, FL (US)

(73) Assignee: ADIC, Inc., Longview, FL (US)

( * ) Notice: Subject to any disclaimer, the term of this patent is extended or adjusted under 35 U.S.C. 154(b) by 393 days.

(21) Appl. No.: 12/477,049

(22) Filed: Jun. 2, 2009

Related U.S. Application Data

(60) Provisional application No. 61/058,473, filed on Jun. 3, 2008.

(51) Int. Cl.
*H03F 3/08* (2006.01)
(52) U.S. Cl. ............... 250/208.1; 250/214 R; 250/214 A
(58) Field of Classification Search ............... 250/208.1, 250/208.2, 214 R, 214 C, 214 A
See application file for complete search history.

(56) References Cited

U.S. PATENT DOCUMENTS

| | | | |
|---|---|---|---|
| 3,891,843 A | 6/1975 | Parkin | |
| 3,943,360 A | 3/1976 | Parkin | |
| 4,037,932 A | 7/1977 | Haas et al. | |
| 4,227,155 A | 10/1980 | Lerma | |
| 4,535,232 A | 8/1985 | Elliott et al. | |
| 4,551,623 A | 11/1985 | Elliott et al. | |
| 4,881,813 A | 11/1989 | Koo et al. | |
| 4,943,712 A | 7/1990 | Wilder | |
| 5,046,848 A | 9/1991 | Udd | |
| 5,155,348 A | 10/1992 | Ballingal et al. | |
| 5,495,100 A | 2/1996 | Takeshima | |
| 6,040,568 A | 3/2000 | Caulfield et al. | |
| 6,303,922 B1 | 10/2001 | Kasper | |
| 6,326,603 B1 | 12/2001 | Kuderer | |
| 6,627,894 B2 | 9/2003 | Mitsuda et al. | |
| 6,747,264 B2 | 6/2004 | Miida | |
| 7,291,822 B2 * | 11/2007 | Olsen et al. | 250/208.1 |
| 7,358,472 B2 | 4/2008 | Hamilton | |
| 7,462,811 B2 * | 12/2008 | Cok et al. | 250/214 AL |
| 7,473,883 B2 * | 1/2009 | Olsen et al. | 250/214 A |
| 7,595,476 B2 * | 9/2009 | Beer et al. | 250/214 R |
| 7,652,243 B2 * | 1/2010 | Olsen et al. | 250/214 A |
| 2003/0098406 A1 | 5/2003 | Kusuda et al. | |
| 2004/0144913 A1 | 7/2004 | Fennelly et al. | |
| 2005/0127280 A1 | 6/2005 | Ura | |
| 2005/0253057 A1 | 11/2005 | Hamilton et al. | |
| 2005/0258341 A1 | 11/2005 | Nishikawa et al. | |
| 2007/0170351 A1 | 7/2007 | Partain et al. | |

* cited by examiner

*Primary Examiner* — Tony Ko
(74) *Attorney, Agent, or Firm* — Russell D. Culbertson; The Culbertson Group, P.C.

(57) ABSTRACT

A photoconductor read out circuit includes a biasing signal generator connected to apply an alternating current biasing signal to a first terminal of the photoconductor. An input capacitance connected to a second terminal of the photoconductor stores charge applied to that terminal. A charge transfer amplifier included in the read out circuit receives a demodulating signal and functions to transfer charge to a summing node in response to the charge stored by the input capacitance and in coordination with the demodulating signal. A charge collection arrangement included in the read out circuit selectively resets the summing node to a base charge level, and stores charge applied to the summing node between resets to the base charge level. A sampling arrangement included in the read out circuit selectively applies a charge from the summing node to an output node, selectively presets the output node to a base output charge level, and stores charge applied to the output node between presets to the base output charge level. The charge stored at the output node between presets represents an output data signal from the read out circuit.

20 Claims, 14 Drawing Sheets

METHOD OF OPERATING A PHOTOCONDUCTOR IN AN IMAGING SYSTEM, AND READ-OUT CIRCUIT EMPLOYING AN AC-BIASED PHOTOCONDUCTOR

CROSS-REFERENCE TO RELATED APPLICATION

The Applicants claim the benefit, under 35 U.S.C. §119(e), of U.S. Provisional Patent Application Ser. No. 61/058,473, filed Jun. 3, 2008, and entitled "Method Of Operating A Photoconductor In An Imaging System And Read-Out Integrated Circuit Employing An AC-Biased Photoconductor Array." The entire content of this provisional application is incorporated herein by this reference.

TECHNICAL FIELD OF THE INVENTION

The present invention relates to high speed imaging systems, and particularly imaging systems using an array of photoconductors for detecting incident light energy and providing information from which an image may be formed. More particularly, the invention relates to a circuit which extracts photoconductor information using an alternating current (AC) bias for the photoconductor. The invention includes a read-out integrated circuit (ROIC) which employs an array of photoconductors. An ROIC unit cell is included in the ROIC for each photoconductor in the array for extracting information from the respective photoconductor. The invention also encompasses methods of operating a photoconductor to provide data for an image to be produced in an imaging system.

BACKGROUND OF THE INVENTION

The application of direct current bias has been the historical method of operating a photoconductor as a detector. However, direct current bias produces objectionable low frequency noise, limits dynamic range, and absorbs excessive power. Furthermore, the manufacturing technology used to produce an array of photoconductors inherently results in variations in resistance and response between the various photoconductors included in the array. This variation is so wide that there is little dynamic range left for employing the photoconductors as detectors.

SUMMARY OF THE INVENTION

The present invention includes a read out circuit for generating an output signal indicative of the photonic energy absorbed by a photoconductor. An array of these read out circuits may be used to produce data representative of an image, with each read out circuit providing the data for a single pixel of the image. The invention also encompasses a device including number of read out circuits, each associated with a different photoconductor in an array of photoconductors. Methods of producing a signal indicative of the photonic energy absorbed by a photoconductor are also encompassed within the scope of the present invention.

One preferred read out circuit embodying the principles of the invention receives an alternating current biasing signal from a biasing signal generator. The alternating current biasing signal is applied to a first terminal of the photoconductor. Input capacitance means is connected to a second terminal of the photoconductor for storing charge applied to that terminal. Charge transfer amplifier means included in the read out circuit receives a demodulating signal and functions to transfer charge to a summing node in response to the charge stored by the input capacitance means and in coordination with the demodulating signal. Charge collection means included in the read out circuit selectively resets the summing node to a base charge level, and stores charge applied to the summing node between resets to the base charge level. The read out circuit further includes sampling means. The sampling means selectively applies a charge from the summing node to an output node, selectively presets the output node to a base output charge level, and stores charge applied to the output node between presets to the base output charge level.

In one preferred form of the invention, the input capacitance means includes an input capacitor connected between the second terminal of the photoconductor and an input reference voltage, and one or more input adjustment circuits. Each input adjustment circuit may include an input adjustment capacitor connected in series with an input adjustment transistor between the second terminal of the photoconductor and the input reference voltage. The input adjustment transistor may be controlled to selectively connect the corresponding input adjustment capacitor in parallel with the input capacitor between the second terminal of the photoconductor and the input reference voltage, and thereby change the overall capacitance seen at the second terminal of the photoconductor. A respective memory cell for each input adjustment circuit may have an output connected to the gate of the input adjustment transistor of that input adjustment circuit for switching the respective input adjustment capacitor in or out of the circuit.

The charge collection means in one form of the invention includes a summing capacitor connected between the summing node and a summing reference voltage, and one or more summing adjustment circuits for selectively adding capacitance in parallel with the summing capacitor between the summing node and the summing reference voltage. These summing adjustment circuits may have a structure similar to that of the input adjustment circuits, with each summing adjustment circuit ultimately controlled through the output of a respective memory cell.

A method according to one form of the present invention includes applying an alternating current biasing signal to a first terminal of a photoconductor and storing a charge appearing at the second terminal of the photoconductor. This charge is stored with an input capacitance connected to the second terminal of the photoconductor. For each of a number of cycles of the alternating current biasing signal, the method further includes transferring charge to a summing node in response to (i) the charge stored by the input capacitance, and (ii) a demodulating signal. The charge transferred to the summing node is stored with a summing capacitance connected to the summing node, and this charge stored at the summing node is transferred to an output node where it is again stored with an appropriate output capacitance connected to the output node. The method then includes isolating the charge at the output node from the summing node. This isolated charge at the output node comprises a data signal representative of the photonic energy absorbed by the photoconductor.

The read out circuit according to the present invention provides low frequency noise suppression, nonuniformity correction, and dynamic range compression. In particular, the alternating current biasing arrangement for the photoconductor greatly reduces low frequency noise as compared to direct current-biasing arrangements. The ability to modify the capacitance at the input node of the read out circuit provides for correction of dark resistance nonuniformity in the photoconductor, while the ability to modify the capacitance at the summing node of the read out circuit provides for temperature response nonuniformity correction. Dynamic range compression is facilitated through summing the charge transfer amplifier output over some number of cycles of the alternating current biasing signal to the photoconductor.

These and other advantages and features of the invention will be apparent from the following description of the preferred embodiments, considered along with the accompanying drawings.

DESCRIPTION OF PREFERRED EMBODIMENTS

Figure 1:
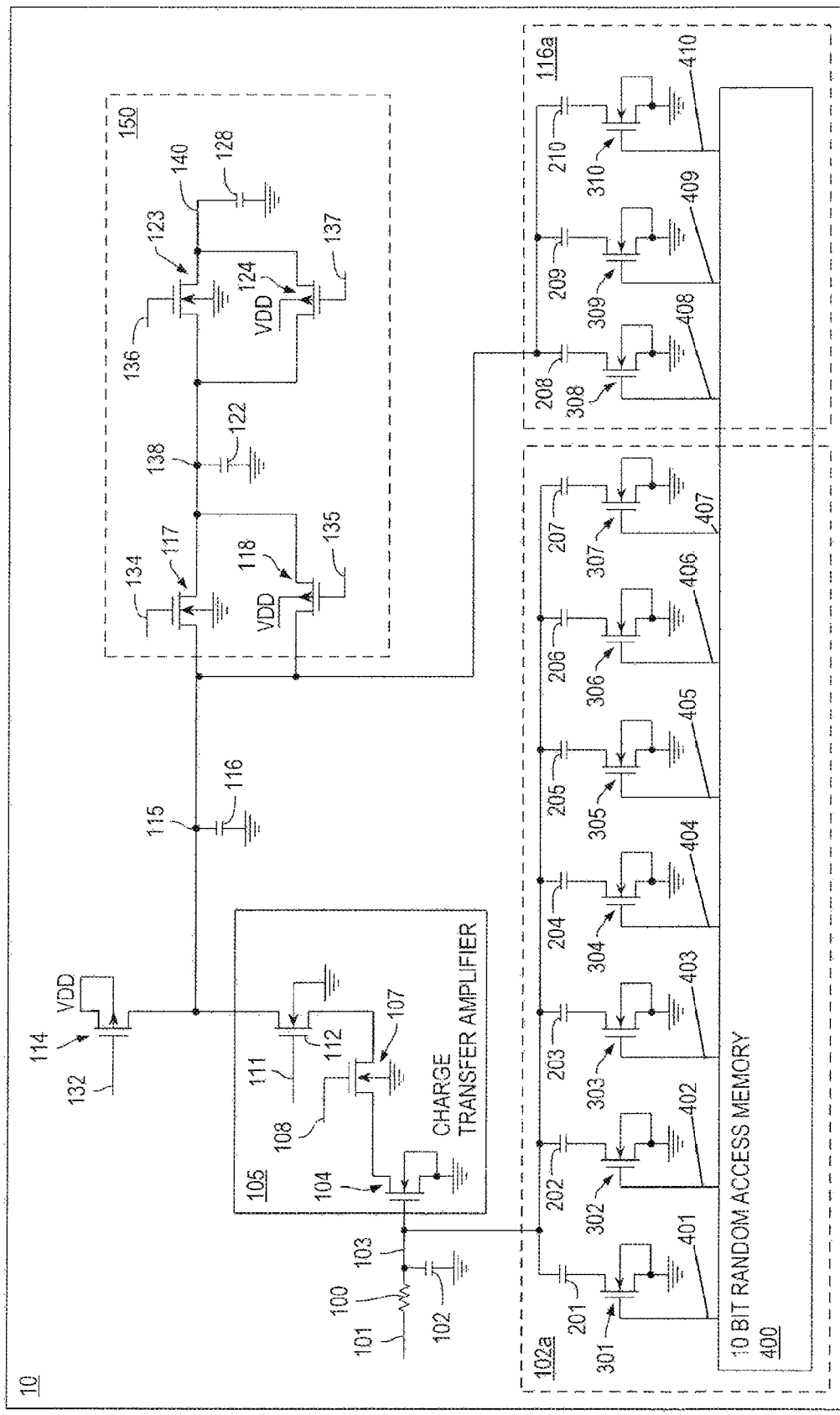
FIG. 1 is a schematic drawing of a single ROIC unit cell of an ROIC circuit in accordance with one embodiment of the present invention.

FIG. 1 shows a schematic drawing of a ROIC unit cell 10 which represents one cell of a ROIC for an array of photoconductors. The photoconductor for ROIC unit cell 10 is shown at reference numeral 100 in FIG. 1 and is illustrated as a resistance. As used in this disclosure, photoconductor 100 will be referred to as a detector since it functions to provide a signal indicative of the photonic energy which it absorbs. Although the following discussion will focus on the operation of ROIC unit cell 10, it will be appreciated that the overall ROIC will include an array of detectors 100, each included in a separate ROIC unit cell having a respective read out circuit for that detector. Each such ROIC unit cell will include the same components and operate in the same way as described below in connection with the illustrated example ROIC unit cell 10 shown in FIG. 1. It should also be noted that the invention is not limited to any particular array size. For example, a detector array within the scope of the present invention may include a 600 by 400 planar array of detectors, with each detector providing information for one pixel of a 600 by 400 pixel image. Preferably, but not necessarily, each ROIC unit cell 10 included in a ROIC is implemented in an integrated circuit on a common substrate, with the respective detector 100 mounted in some suitable fashion. The additional circuitry required for processing the information extracted from each detector 100 may be included in one or more separate integrated circuits.

The following discussion generally assumes that detector 100 is operable in the infrared range, and is thus used for infrared imaging. However, the invention is not limited to detectors that operate in the infrared range. Rather, the present invention is applicable to photoconductor detectors that are designed to operate in any wavelength range. Regardless of the particular type of light detected by the detectors, ROIC unit cell 10 provides low frequency noise suppression, nonuniformity correction, dynamic range compression, and antialias filtering.

A time division multiplexing arrangement is associated with the ROIC for transmitting the data signal from each respective ROIC unit cell 10 on to additional processing circuitry for further processing according to the desired use of the image data. This time division multiplexing arrangement is not shown in FIG. 1, but will be described below with reference to the embodiment shown in FIG. 6.

In the ROIC unit cell embodiment shown in FIG. 1, a biasing signal is applied at a biasing node 101 to detector 100. Although not shown in FIG. 1, it will be appreciated that biasing node 101 is common to each detector 100 in the array. Thus each detector 100 in the array of detectors receives the same biasing signal.

According to the invention, the biasing signal applied at biasing node 101 in ROIC unit cell 10 comprises a periodic, alternating current rectangular pulse or carrier wave. The on-off action of the carrier wave acts as a form of electronic chopping. Detector 100 is returned to electrical ground (or other suitable reference voltage) through an input capacitor 102, which blocks direct current flow at an input node 103. Additional capacitance may be added in parallel with input capacitor 102 to adjust the capacitance seen at input node 103. This adjustment is accomplished in the illustrated embodiment by the input capacitance adjustment arrangement 102*a* in FIG. 1. Adjusting the capacitance value seen at input node 103 corrects the time constant formed by detector 100 and input capacitor 102 which effectively corrects the dark resistance nonuniformity of the detector. The input capacitance adjustment arrangement 102*a* which functions to adjust the capacitance seen at input node 103 includes adjustment capacitors 201 through 207. Each adjustment capacitor 201 through 207 is controlled by a respective switch 301 through 307, and the state of each switch 301 through 307 is controlled by the signal at the respective node 401 through 407. The signal appearing at each respective node 401 through 407 represents the output of a single memory cell included in the 10-bit random access memory shown diagrammatically at reference numeral 400 in FIG. 1. It will be noted that only seven bits of 10-bit memory unit 400 are used to control switches 301 through 307. Each one of the remaining three bits of 10-bit memory unit 400 is used to control the state of a respective one of the additional switches 308 through 310 as will be described further below. It should also be noted here that the term "switch" is used in this disclosure to refer to a respective transistor in ROIC unit cell 10 which performs a switching function in the circuit.

The carrier wave applied at biasing node 101 is modulated by the resistance of detector 100 to produce a modulated signal at input node 103. This input node 103 provides the input to a charge transfer amplifier 105 which serves to transfer charge to an amplifier output as will be discussed further below. The coherent output switch 107 of charge transfer amplifier 105 synchronously conducts for a short time during the input carrier pulse minima. The result is that charge transfer amplifier 105 provides a current pulse whose charge is proportional to the photo conductance of detector 100. The input transistor 104 of charge transfer amplifier 105 is usually large to improve noise and uniformity performance. Output switch 107, which may also be referred to as a "demodulating transistor," performs the demodulation function of charge transfer amplifier 105. Global gain adjustments can be made by varying the conduction time of output switch 107. This is accomplished by adjusting the width of the pulse on line 108. In addition to the input transistor 104 and demodulating output switch 107 included in charge transfer amplifier 105, the amplifier further includes a charge injection suppression transistor 112. A relatively low bias voltage is applied at node 111 connected to the gate of charge injection suppression transistor 112. The relatively low bias voltage applied at node 111 of charge injection suppression transistor 112 has the effect of increasing the output resistance of charge transfer amplifier 105 and suppressing charge injection by output switch 107 into the node at the output of the charge transfer amplifier.

The charge through charge transfer amplifier 105 is applied to a summing node 115 of ROIC unit cell 10. Summing node 115 is returned to ground through a summing capacitor 116, which is precharged to the power supply voltage for each signal reading cycle of ROIC unit cell 10. This precharge is provided through a reset switch 114 under the control of a reset signal applied at a rest control node 132 connected to the gate of reset switch 114. Each charge pulse through charge transfer amplifier 105 acts to discharge summing capacitor 116. The amount of discharge is dependent upon the resistance provided by detector 100 which is in turn dependent upon the amount of photonic energy absorbed by the detector. Thus the characteristic discharge of summing capacitor 116 and the resultant voltage signal at summing node 115 is indicative of the amount of light absorbed by detector 100. Typically, several discharge pulses are summed in summing capacitor 116 to produce a summed voltage signal at summing node 115. Because the discharge pulses add in a linear manner at summing node 115 while the noise adds as the root of the sum of squares, summing the charge signal according to this embodiment of the invention improves the noise ratio of ROIC unit cell 10.

ROIC unit cell 10 includes a summing capacitance adjustment arrangement for adjusting the capacitance seen at summing node 115. This summing capacitance adjustment arrangement is shown at 116a in FIG. 1, and includes three capacitors 208, 209, and 210 which may be selectively added in parallel with summing capacitor 116. Each capacitor 208, 209, and 210 is controlled by a respective switch 308, 309, and 310 and each switch is controlled through the signal at a respective switch control node 408, 409, and 410. The signals provided at the switch control nodes 408, 409, and 410 are provided by a respective cell of the 10-bit random access memory 400 shown in FIG. 1. The capacitance adjustment provided by summing capacitance adjustment arrangement 116a facilitates correction of any response nonuniformity of detector 100 with respect to other detectors in the detector array.

ROIC unit cell 10 illustrated in FIG. 1 includes an additional filtering arrangement comprising switched capacitor filter 150 to filter the signal at summing node 115. This filtering arrangement may be operated to decrease the bandwidth to the optimal antialias frequency of half the frame rate of the image output of the imaging system in which ROIC unit cell 10 is included, thereby meeting the Nyquist criterion for the image and removing motion artifacts from the image. Switched capacitor filter 150 is made up of switches 117 and 118, capacitor 122, switches 123 and 124, and capacitor 128. Switches 117 and 118 are controlled by the signals at nodes 134 and 135, respectively, while switches 123 and 124 are controlled by the signals at nodes 136 and 137, respectively. Capacitor 122 is connected to node 138 while capacitor 128 is connected to node 140. This node 140 represents the output node for ROIC unit cell 10 and is read through a multiplexing arrangement to be discussed below in connection with the embodiment of FIG. 6.

Charge transfer amplifier 105 operates in the sub-threshold range. This produces a logarithmic transfer curve that produces dynamic range compression. This is a desirable feature in infrared imaging because hot objects tend to lose contrast if the saturation of the transfer characteristic is sharp.

The static random access memory shown diagrammatically at reference numeral 400 in FIG. 1 is included in ROIC unit cell 10 for the purpose of nonuniformity correction. Both the dark resistance, that is, the resistance exhibited by a given detector 100 in the absence of any absorbed light, and the detector response to incident light are nonuniform between the various detectors 100 in the array. This memory is real time programmable and adjusts the value of capacitance seen at input node 103 and summing node 115. The capacitance in parallel with input capacitor 102, that is, the total capacitance seen at input node 103 in FIG. 1, is adjusted to improve the uniformity of dark resistance output by the different cells in the array. The capacitance in parallel with summing capacitor 116, that is, the total capacitance seen at summing node 115, is adjusted to correct for photo response nonuniformity between the different detectors 100 in the array. The illustrated ROIC unit cell 10 employs seven bits of memory 400 to correct the dark resistance by a factor of 128:1. Three bits of memory 400 are used to correct photo response by a factor of 8:1. One preferred method of setting memory 400 to correct for dark resistance variation and photo response variation will be described below in connection with the alternate embodiment shown in FIG. 6.

Figure 2:
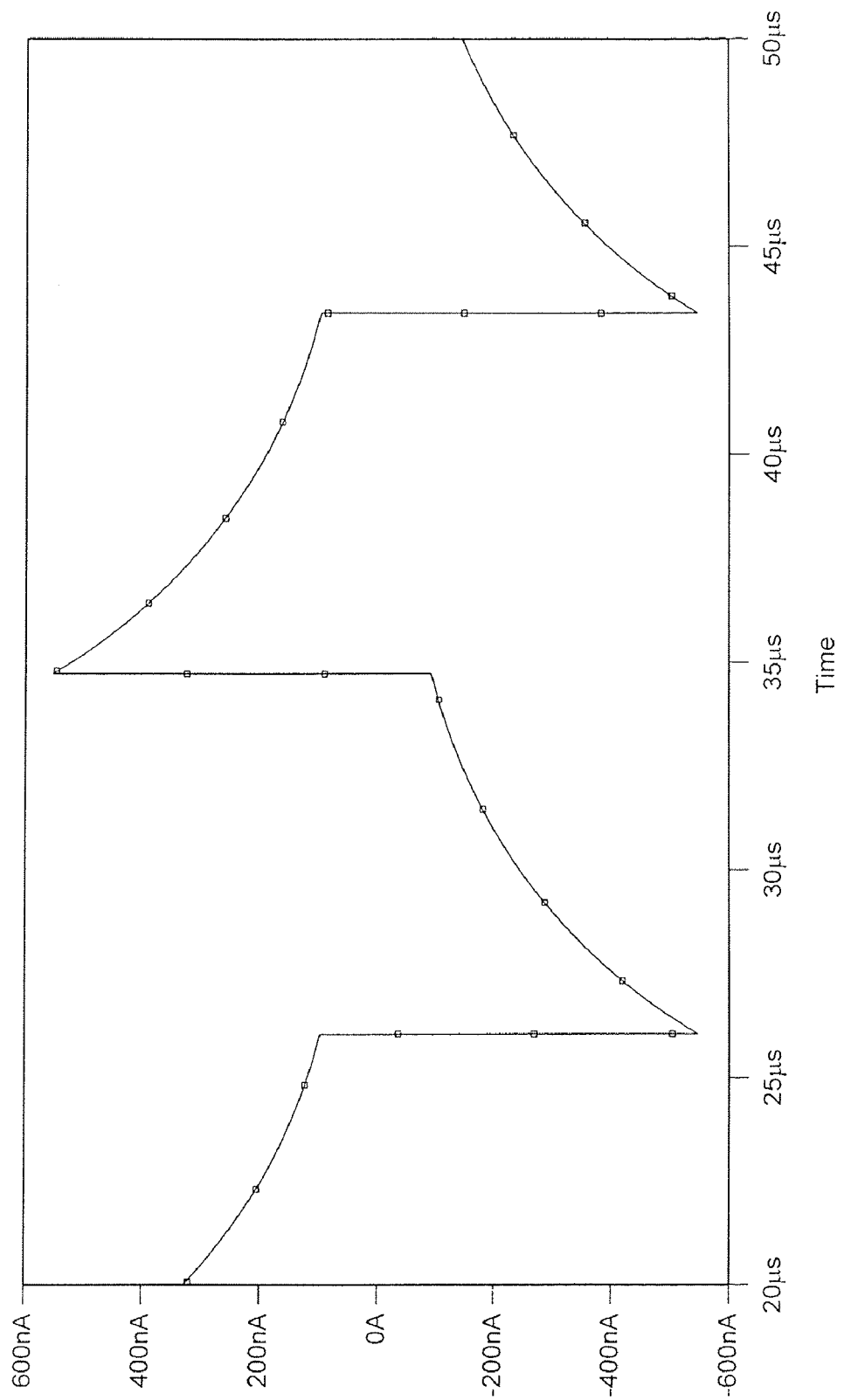
FIG. 2 is a graph showing photoconductor current of the ROIC unit cell shown in FIG. 1 as a function of time.

FIG. 2 is a graph of the current through detector 100 in FIG. 1 over time in view of the AC rectangular pulse carrier wave applied at node 101. The purpose of using an AC carrier wave is to minimize or eliminate noise, noise being defined as any random process or event. In a photoconductor, the time between the generation of a charge carrier until it is recombined is called the carrier life time. Carrier life time has two random characteristics. First, there is a random Gaussian distribution about the mean carrier life time. Second, some charge carriers get caught in material defect traps in the photoconductor material, which result in the equivalent of a very long carrier life time. These trapped and slowly released charge carriers arrive at the electrodes of the photoconductor at a rate that is a constant percentage per decade of time. This long term noise is commonly called 1/f noise. Photoconductor noise is dominated by 1/f noise. If the current through the photoconductor material making up the detector can be made to rapidly change direction, as shown in FIG. 2, then the 1/f noise charge carriers will average to nearly zero where half arrive at one electrode and half at the other electrode. In this manner, the 1/f noise is greatly reduced.

Figure 3:
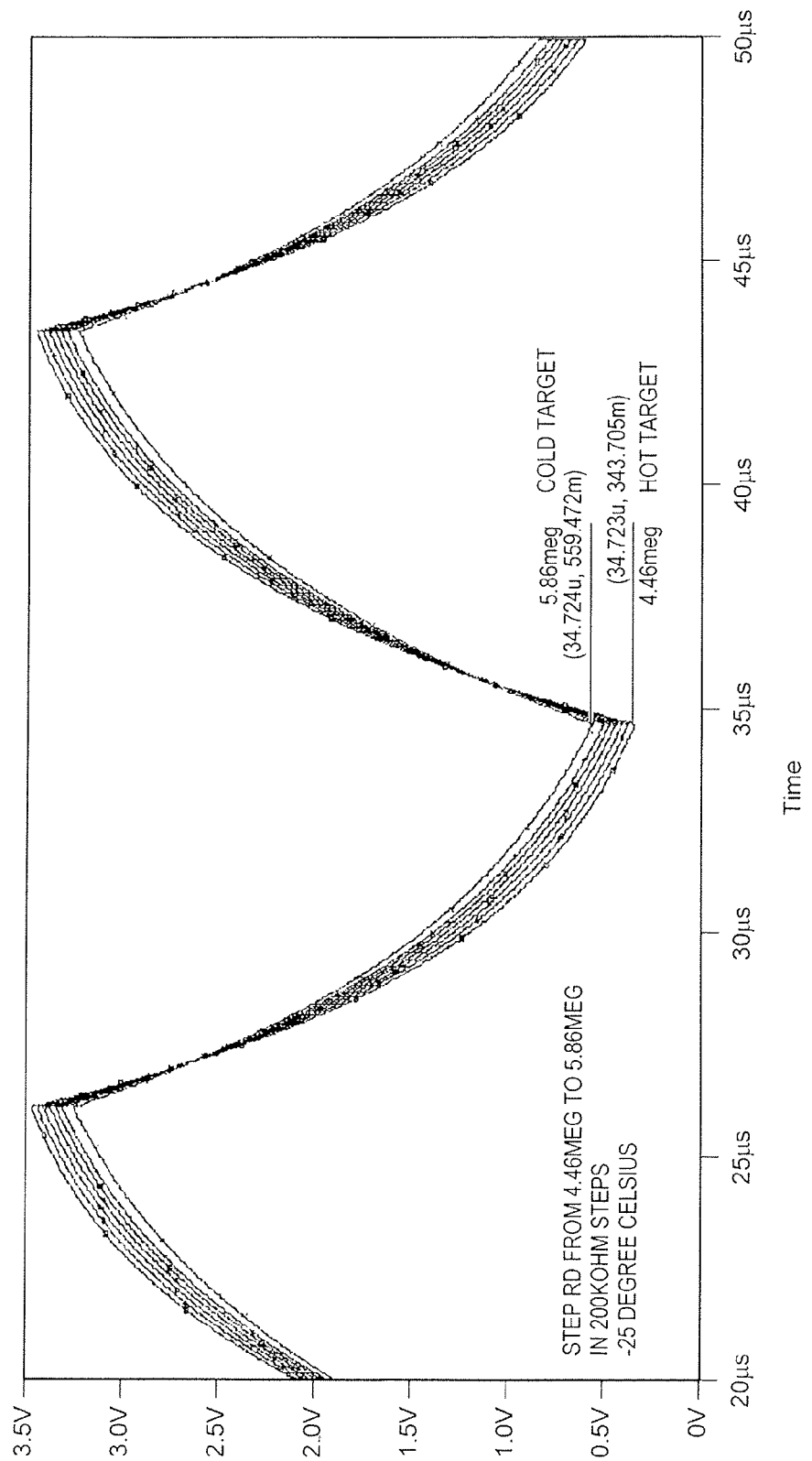
FIG. 3 is a graph showing the voltage at an input node of the ROIC unit cell shown in FIG. 1 for different conductivity values of the respective photoconductor for the ROIC unit cell.

FIG. 3 plots the voltage at input node 103 shown in FIG. 1 against time. This voltage signal represents the charge held by input capacitor 102 shown in FIG. 1 and any of the adjustment capacitors 201 through 207 that are placed in parallel with input capacitor 102 using the switches 301 through 307 controlled through memory 400. The respective input capacitor 102 of each cell in the array is adjusted in the absence of detectable light so that the output voltage from the various cells in the array is as uniform as possible across the entire array in the absence of any light input to the detectors 100 in the array. This adjustment sets the time constant between the carrier wave input at biasing node 101 in FIG. 1 and the voltage at input node 103. As photonic energy absorbed by the detector increases, the conductivity of the photoconductor increases. This increase in conductivity is proportional to the power of the absorbed photonic energy. This shortens the time constant and causes the voltage at input node 103 to decrease. The particular detector 100 of ROIC unit cell 10 in FIG. 1 on which the plot of FIG. 3 is based has a cold target resistance of 5.86 Mega ohms and decreases to a hot target resistance of 4.46 Mega ohms. The corresponding voltages at input node 103 for that ROIC unit cell 10 are 0.559 volts and 0.343 volts respectively. The lower voltage applied to the gate of transistor 104 in the ROIC unit cell 10 of FIG. 1 will result in less charge through the drain of transistor 104 compared to the larger gate voltage.

Figure 4:
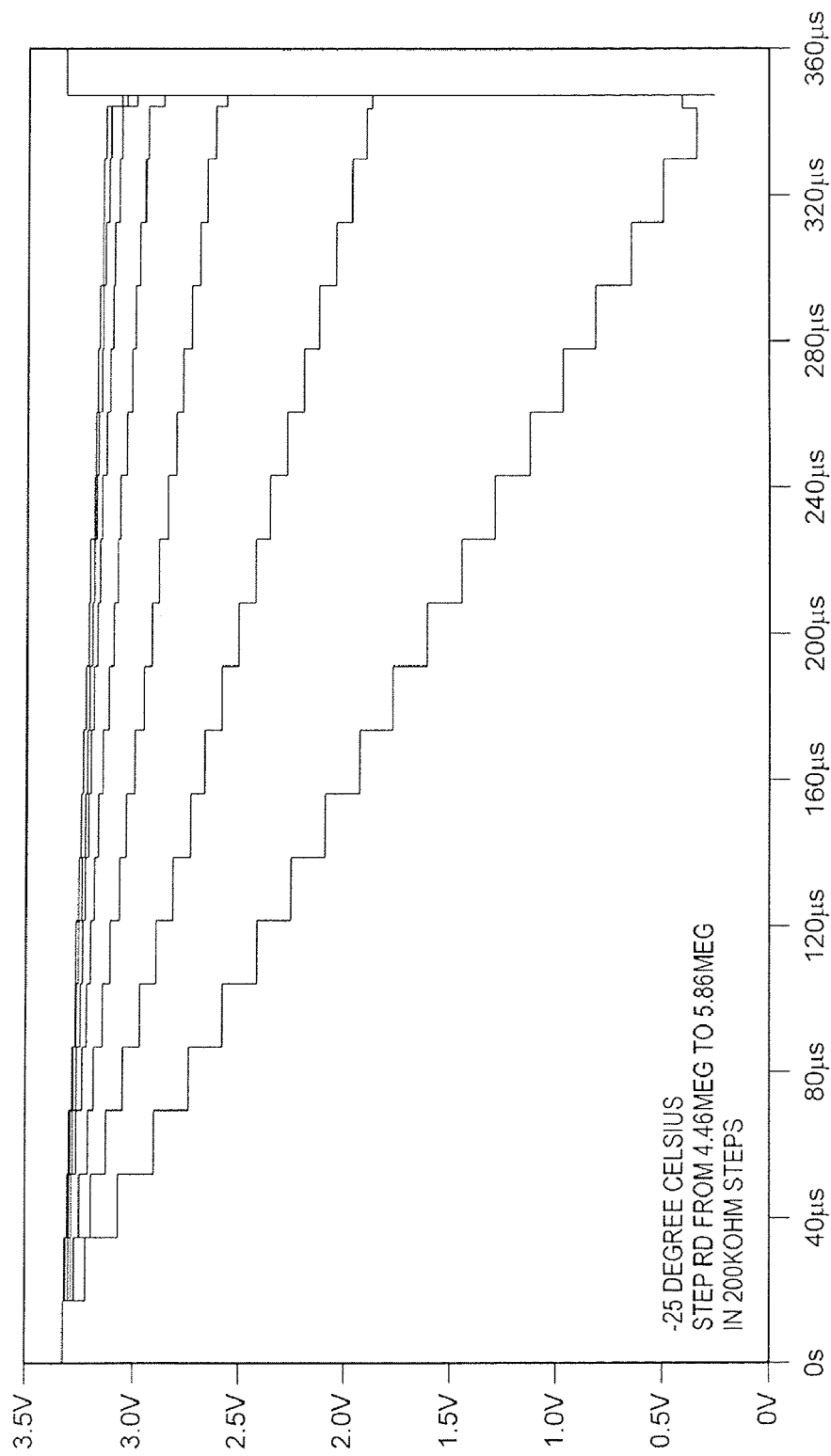
FIG. 4 shows staircase integrator output waveforms of the ROIC unit cell shown in FIG. 1 assuming different resistance values exhibited by the photoconductor for the respective ROIC unit cell.

FIG. 4 plots waveforms at the output of amplifier 105, that is, at summing node 115 in FIG. 1 against time for a single detecting cycle of the ROIC unit cell 10. Each waveform shown in FIG. 4 represents the characteristic waveform at a different given incident light level absorbed by the detector 100 of the circuit. At a precise instant and for a precise time interval, just before the voltage at input node 103 in FIG. 1 rises, demodulating switch 107 conducts the drain current of input transistor 104 through transistor 112 to summing node 115 and summing capacitor 116. The voltage at node 111, which is connected to the gate of transistor 112 in FIG. 1, is held at a relatively low constant voltage (perhaps 1 volt). This keeps the voltage across switch 107 low and significantly reduces any charge injection that may be deposited on summing capacitor 116 as a consequence of the voltage across switch 107. This is important as it is desirable to make multiple summations of charge onto summing capacitor 116 and charge injection would corrupt this process. In addition, transistor 112 in FIG. 1 increases the output resistance of charge transfer amplifier 105. This is important as modern sub micron semiconductor devices have relatively low output resistance. Since charge transfer amplifier 105 shown in FIG. 1 is a transfer conductance amplifier, it is important that output resistance be large to approximate current source outputs.

Reset switch 114 in ROIC unit cell 10 shown in FIG. 1 is used to reset the operating voltage in capacitor 116 to the upper supply rail voltage VDD. This is performed only once for each detecting cycle of the ROIC unit cell 10 and then for the remainder of the detecting cycle a large number of charge summations are preferably made at summing node 115 in FIG. 1. For instance, there are twenty summations in the demonstration waveform shown in FIG. 4. Notably, there is a tiny positive step at the end of the cycle. This is a result of the sampling process by the switched capacitor filter arrangement 150 shown in FIG. 1.

Figure 5:
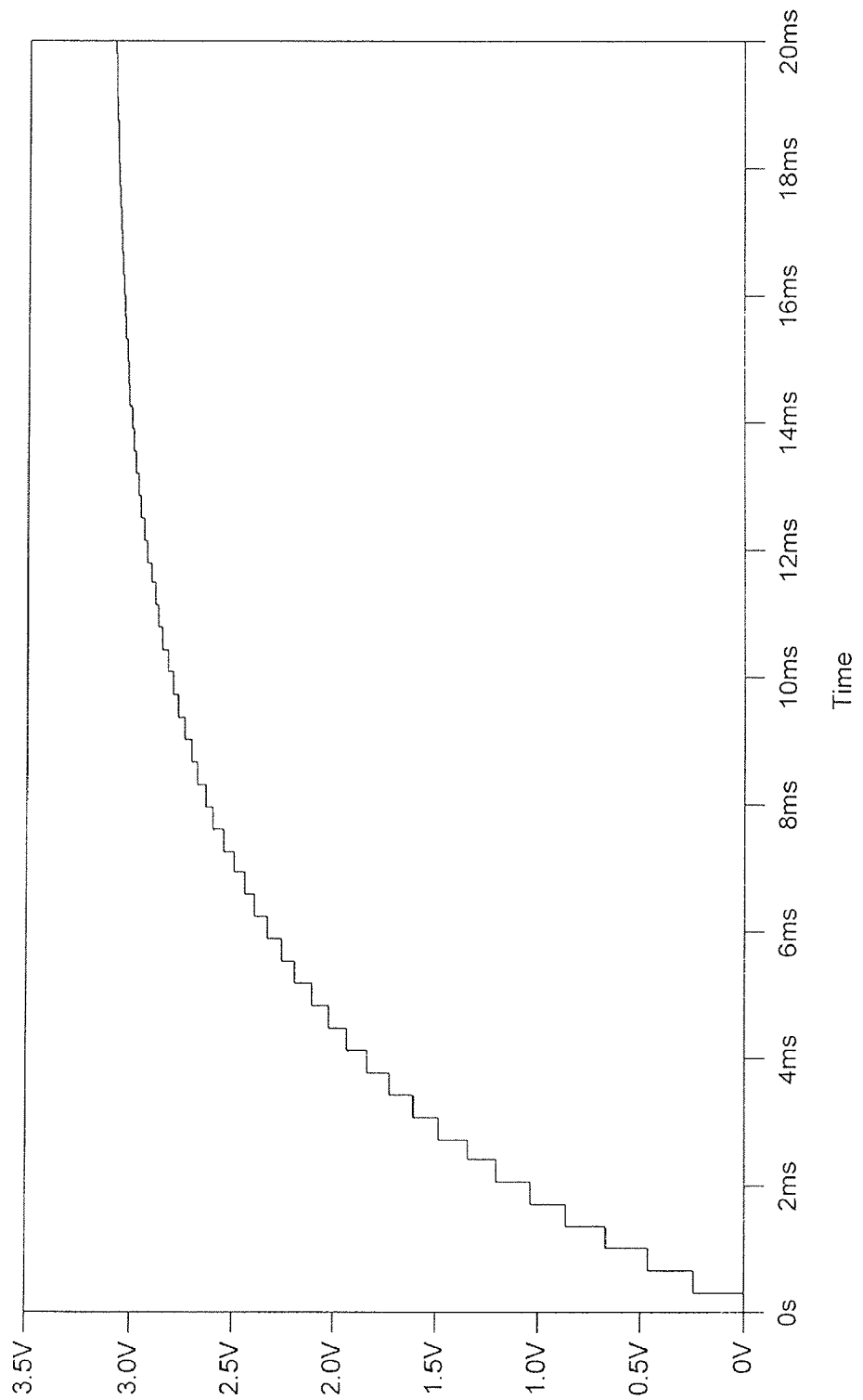
FIG. 5 shows the step response of a switched capacitor filter of the ROIC unit cell shown in FIG. 1.

FIG. 5 illustrates the step response of a typical switched capacitor filter such as switched capacitor filter arrangement 150 shown in FIG. 1. This filter has two bi-directional analog switches 117/118 and 123/124 shown in FIG. 1 and two capacitors 122 and 128. The switches never conduct at the same time. Capacitor 122 is a small capacitor and is often called a cup. The larger capacitor 128 is known as the bucket. The switch sequence is usually as follows. Initially, switch 117/118 conducts so that the cup 122 is in parallel with summing capacitor 116 and collects charge. The charge transfer timing sequence starts by ceasing conduction through switches 117/118. This isolates capacitor 122 from summing capacitor 116. Subsequently, switch 123/124 conducts and the small charge from capacitor 122 is shared with the residual charge in capacitor 128. Since charge is delivered per unit time, the cup capacitor acts like a resistor, since its time history is periodically destroyed by the reset operation and the insertion of a new charge during the stair step integration process. Thus filter circuit 150 in FIG. 1 behaves like a continuous time, low pass resistor-capacitor filter.

The key wave forms in ROIC unit cell 10 shown in FIG. 1 are the carrier wave form applied at biasing node 101, the modulated gate waveform at input node 103, the reset pulse applied to reset switch 114 through node 132, and the demodulating signal applied to switch 107 through node 108 in FIG. 1. The reset pulse at node 132 could occur, for example, once per twenty periods of the carrier wave applied at biasing node 101 and the demodulating signal at node 108 to permit the formation of the staircase integrator. The rectangular wave shape of the carrier wave applied at node 101 is convenient as the amplitude can be controlled by the average value of the array output as a means of image feedback to assist low detected light stability. The waveform at input node 103 is integrated by the detector resistance provided by detector 100 in FIG. 1, and composite value of input capacitor 102 and any additional capacitance provided through input capacitance adjustment arrangement 102a into a saw tooth shape shown in FIG. 3. At the nadir of the saw tooth wave form shown in FIG. 3, the demodulation pulse at node 108 in FIG. 1 causes demodulating switch 107 to conduct which produces another step in the staircase output illustrated in FIG. 4. After a specified number of stair step integrations at summing node 115, the switched capacitor filter arrangement 150 takes a sample. Subsequently, a short reset pulse at reset node 132 returns the voltage at summing node 115 to the positive rail voltage. This completes the operation of the detecting cycle of ROIC unit cell 10 shown in FIG. 1.

Notes on Noise Bandwidth

Any monotonic charge summation process will improve the signal to noise ratio of a signal. For switched capacitor filters the equivalent number of linear summations can be shown to be two times the capacitor ratio plus one. Thus for the filter 150 shown in FIG. 1 the equivalent number of summations is about 16.33. If one assumes that 20 staircase summations occur for each switched capacitor filter summation then there are about 327 total summations per sample from ROIC unit cell 10. The noise bandwidth of the low pass input filter formed by the detector and its load capacitor is one over four times the time constant or about 51 kilo Hertz. Dividing by the number of summations, the equivalent noise band width reduces to 156 Hertz, which is significant.

A typical array size is 640 by 480 detectors 100, each 30 microns on a side, so the array would be 19.2 by 14.4 mm on a side. For an infrared imaging system, the detectors 100

(shown in FIG. 1) would have a nominal dark resistance of 1 Mega ohm at 27 degrees Celsius and 5.86 Meg ohm at −25 degrees Celsius. To fit the ROIC unit cell in the tiny 900 square micron space under the detector, a CMOS foundry with a feature size of 0.18 microns would be selected. Thick gate devices are preferably used in this process to allow 3.3 volt operation. The input capacitance seen at input node 103 in FIG. 1 would have a range of values from 100 to 1000 femto farads in 128 steps as set by memory 400. Memory 400 would preferably be addressed by row and column of the array. The capacitance seen at summing node 115 preferably has an adjustment range from 200 to 400 femto farads in eight steps as set by the last three bits of memory 400 in FIG. 1. This would allow the responsivity of the respective detector 100 to be corrected, which is important for hot target uniformity in infrared imaging systems. All timing can be controlled from off plane in the preferred integrated circuit implementation as can the bias voltage applied at node 111 and the carrier wave maximum voltage applied at biasing node 101 in FIG. 1. The mean and sigma of the output image from the imaging system in which the ROIC unit cell 10 is used can be digitally reduced and used to control the amplitude of voltage carrier wave applied at biasing node 101 in FIG. 1 to assist thermal cooling and to act as a global brightness control of the image. Only small changes are needed for this purpose.

The image frame rate for an imaging system using and ROIC made up of ROIC unit cells such as ROIC unit cell 10 in FIG. 1 would nominally be in the 30 to 60 frames per second range and may be time division multiplexed through a single port, or multiple ports for each application. Higher frame rates are feasible if more multiplexer output ports are used to transfer information from the ROIC unit cells 10 in the detector array.

The operating clock signals for ROIC unit cell 10 in FIG. 1 are the reset signal applied at node 132, demodulator signal applied at node 108, cup isolation signals applied at nodes 134 and 135, and bucket transfer signals applied at nodes 136 and 137. It is possible to derive all of these signals on the same substrate with the ROIC unit cells if desired, or the signals may be generated externally with one or more other integrated circuits. Example generation techniques for the various signals required by a ROIC according to the present invention will be described further below in connection with the alternative embodiment shown in FIG. 6.

Figure 6:
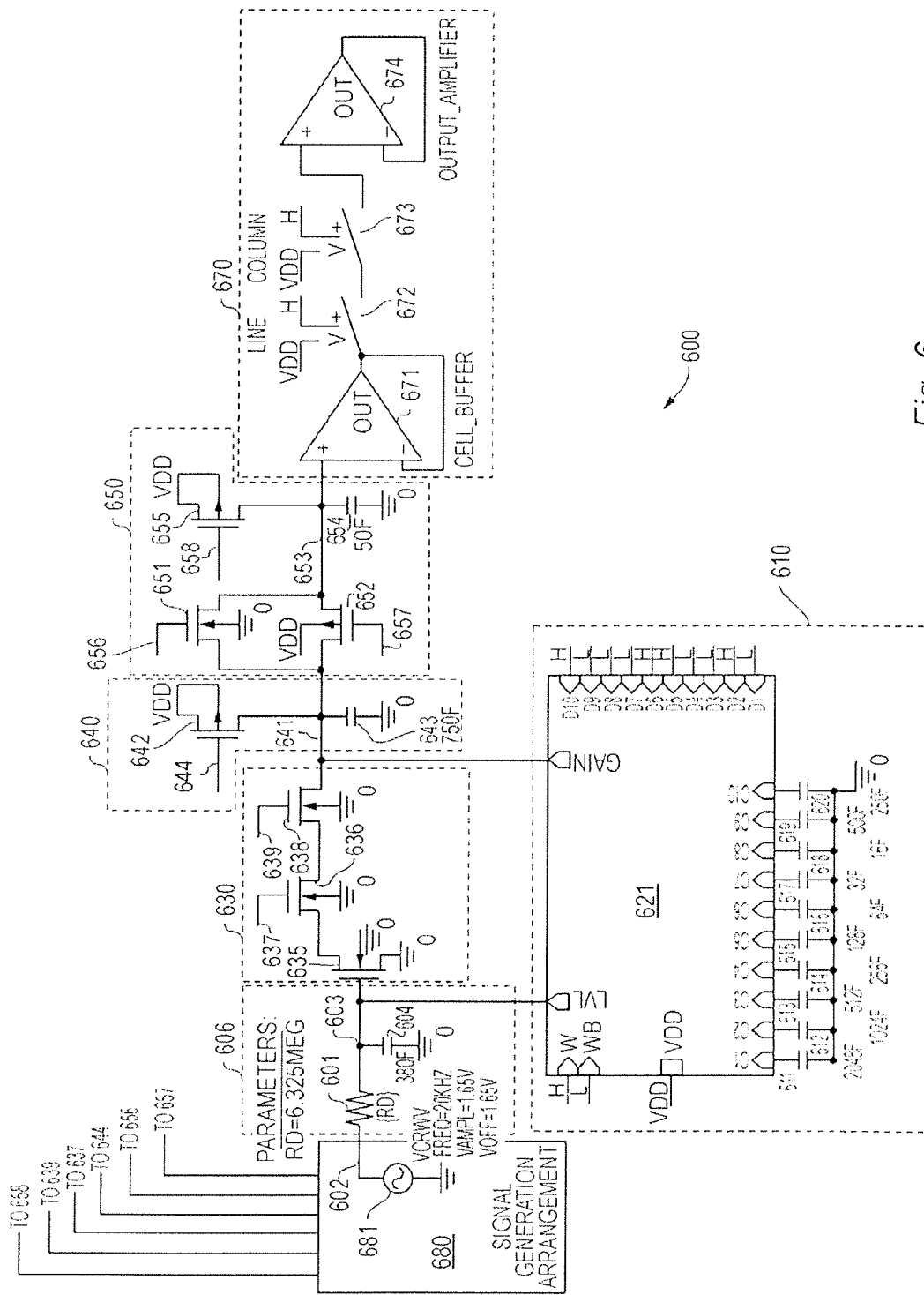
FIG. 6 is a schematic drawing of an alternate ROIC unit cell in accordance with the present invention.

FIG. 6 provides a schematic drawing of an alternate embodiment of a ROIC unit cell 600 within the scope of the present invention. As with ROIC unit cell 10 shown in FIG. 1, ROIC unit cell 600 comprises a circuit for a single cell of a detector array. The detector array itself will be described below in connection with FIGS. 10 and 11. As with ROIC unit cell 10 shown in FIG. 1, ROIC unit cell 600 features low frequency noise suppression, nonuniformity correction, low power dissipation, and dynamic range compression. An output arrangement 670 for selectively transferring data from ROIC unit cell 600 on to other processing elements of an imaging system is also shown in FIG. 6. The components and operation of the output arrangement 670 will be described below after the description of ROIC unit cell 600.

ROIC unit cell 600 shown in FIG. 6 includes a number of input components shown in dashed box 606, a capacitance adjustment arrangement 610, a charge transfer amplifier 630, a charge collection circuit 640, and a sampling circuit 650. It will be noted by comparing FIGS. 1 and 6 that ROIC unit cell 600 omits the switched capacitance filter output arrangement 150 shown in FIG. 1. It will also be noted comparing FIGS. 1 and 6 that the capacitance adjustment arrangement 610 is not shown divided into an input capacitance adjustment arrangement and summing capacitance adjustment arrangement as shown at 102a and 116a in FIG. 1. However, capacitance adjustment arrangement 610 shown in FIG. 6 does provide for capacitance adjustment at both points as will be discussed further below.

The input components shown in dashed box 606 include a single photoconductor 601 (which will be referred to herein as a "detector") represented as a resistance connected between a biasing node 602 and an input node 603. An input capacitor 604 (which represents at least part of an input capacitance means for ROIC unit cell 600) returns input node 603 to ground (or other suitable reference voltage) in parallel with any capacitances added through capacitance adjustment arrangement 610. In this embodiment of the invention, a sinusoidal carrier wave is applied to biasing node 602 of ROIC unit cell 600. As in the previously described embodiment, the carrier wave at biasing node 602 is common to each ROIC unit cell in the array. The capacitance adjustment arrangement 610 provides for adjustment of the capacitance seen at input node 603, and the capacitance at summing node 641, and includes capacitors 611 to 620 controlled through random access memory 621. In the particular embodiment shown in FIG. 6, eight bits of the memory 621 are used to selectively add the capacitors 611 to 618 to input node 603 to adjust the capacitance seen at that node while the final two bits are used to selectively add capacitors 619 and 620 to summing node 641 to adjust the capacitance seen at that node. More information on the particular memory that may be used in capacitance adjustment arrangement 610 will be provided below in connection with FIG. 8.

The time constant formed by the resistance exhibited by detector 601 and the digitally controlled capacitance seen at input node 603 causes a phase and amplitude shift between the voltages observed at biasing node 602 and input node 603. The time occurrence of the minimum voltage of the phase and amplitude voltage at input node 603 when the maximum radiant power is absorbed by detector 601 is used as the coherent sampling instant. This voltage at input node 603 at the coherent sampling instant when there is no radiant power into detector 601 is preferably set by design to the threshold of the charge transfer input transistor 635 described below.

The voltage at input node 603 represents an input to the charge transfer amplifier 630 (representing charge transfer means in ROIC unit cell 600), which is made up of charge transfer input transistor 635, coherent switch transistor (demodulating transistor) 636, and cascade transistor 638. In particular, the voltage signal at input node 603 is applied to the gate of charge transfer input transistor 635 whose drain is connected to coherent switch transistor 636. The gate of coherent switch transistor 636 is controlled by a pulse applied at node 637. Cascade transistor 638 is connected to the output of coherent switch transistor 636 and provides the output of the charge transfer amplifier to charge summing node 641. The gate voltage of cascade transistor 638 is controlled by the voltage at node 639, which is held at a voltage that permits charge transfer input transistor 635 to operate in the subthreshold range. The resistance provided by cascade transistor 638 also reduces charge injection of the coherent switch transistor 636 to the output of charge transfer amplifier 630.

Transistor 635 is operated in the sub-threshold range of its transfer curve. The net result is that the charge transfer characteristic of amplifier 630 approximates a logarithmic curve, which improves dynamic range by compression.

Charge collection circuit 640 (which represents charge collection means in ROIC 600) includes summing node 641 which is selectively connected to the rail voltage VDD through reset transistor 642 and is returned to ground through summing capacitor 643 and any additional capacitance that may be added through capacitance adjustment arrangement 610. In particular, capacitors 619 and 620 may be selectively added to summing node 641 in parallel with summing capacitor 643 under the control of memory 621 to correct for response uniformity of detector 601. The gate of reset transistor 642 is connected to node 644 to receive a reset pulse which for each cycle of operation of ROIC 600, resets the voltage at summing node 641 to the rail voltage.

The sampling circuit 650 of ROIC unit cell 600 represents sampling means in the ROIC unit cell, and includes a charge transfer arrangement made up of charge transfer transistors 651 and 652. Sampling circuit 650 further includes an output node 653, an output capacitor 654, and a preset transistor 655. Node 656 is connected to the gate of charge transfer transistor 651, while node 657 is connected to the gate of charge transfer transistor 652. Node 658 is connected to the gate of preset transistor 655. Sampling circuit 650 functions to periodically share the charge at summing node 641 with output node 653. The resulting voltage signal at output node 653 represents the output of ROIC unit cell 600 to the output arrangement 670 which will be discussed below.

Figure 7:
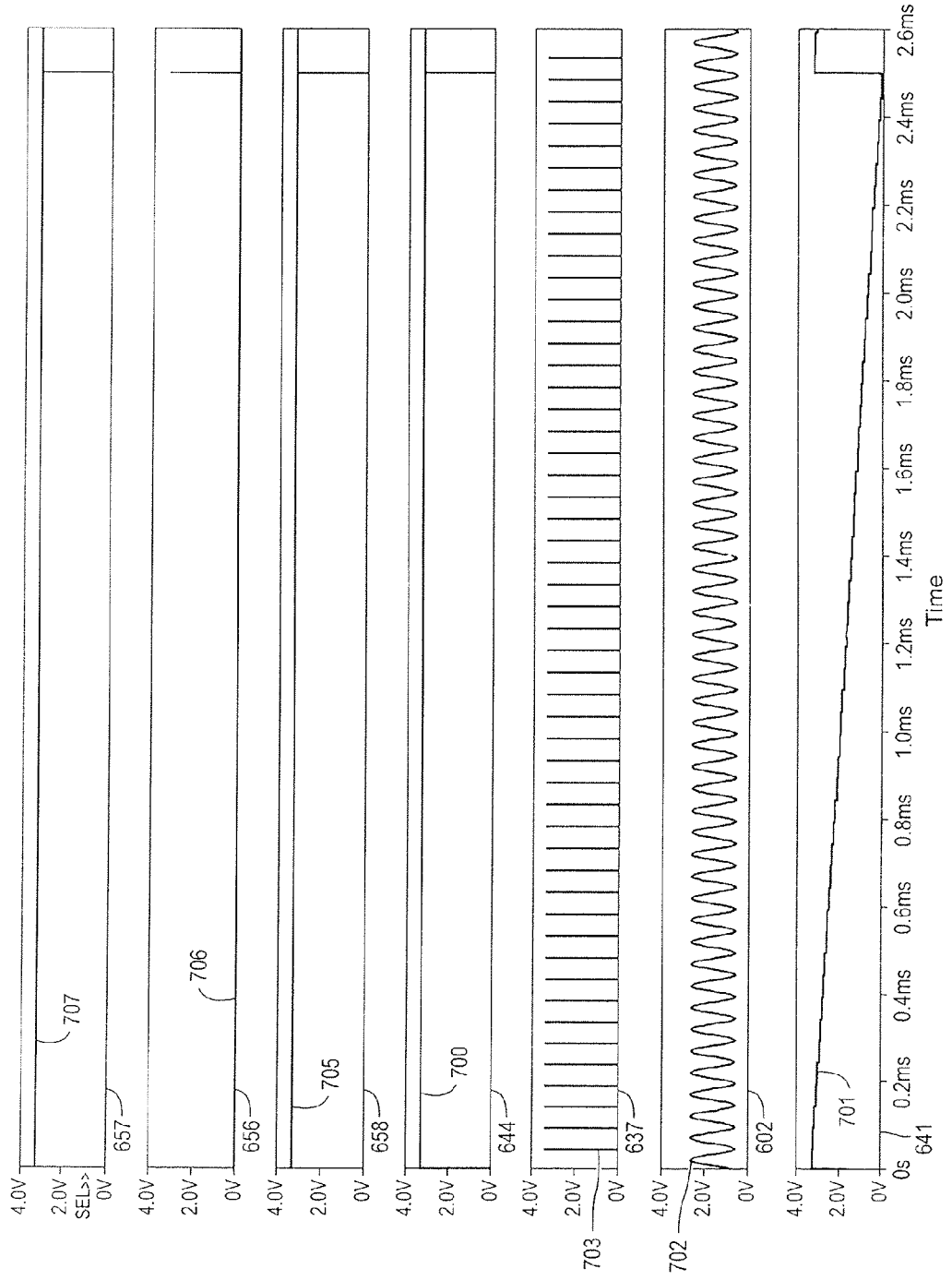
FIG. 7 is a timing chart showing the timing of certain signals used by, or generated in, the ROIC unit cell shown in FIG. 6.

The operation of ROIC unit cell 600 may now be described with reference to FIG. 6 and to the timing charts of FIGS. 7 and 7A. FIG. 7 shows the timing of certain signals in ROIC unit cell 600 and representative signals at certain nodes in ROIC unit cell 600 over the course of time required to collect a single signal representative sample of the conductivity of detector 601. The collected signal represents data for a single pixel in a single video frame. Because the respective data signal collected in ROIC unit cell 600 relates to a video frame, the time period shown in FIG. 7 may be related to the given frame. The starting time shown in FIG. 7 represents the start of a given frame, while the signals at the far right of the figure represent the end of a given frame.

At the start of each frame, summing node 641 in FIG. 6 has just been reset to the rail voltage VDD by the reset pulse applied to reset node 644. The signal applied at reset node 644 is shown as signal 700 in FIG. 7. In view of the reset pulse, the summing node signal 701 in FIG. 7 starts each frame at VDD. Immediately after the voltage at summing node 641 has been reset to VDD, charge transfer amplifier 630 transfers charge to summing node 641 (and particularly summing capacitor 643 and any parallel capacitors) for a short period of time for each cycle of the carrier wave applied at biasing node 602 and corresponding pulse of the demodulating signal applied at node 637 in FIG. 6. The carrier wave is shown as signal 702 in FIG. 7, while the demodulating signal is shown as signal 703. This charge sharing through charge transfer amplifier 630 results in a stair step wave form of the signal 701 at summing node 641, with one drop in the wave form produced on each cycle of the carrier wave and corresponding pulse of demodulating signal 703. It will be noted again that in the summing produced at summing node 641, the noise sums as the root of squares while the transferred charge signal directly sums. In this fashion the signal to noise ratio is improved as the root of the number of summations. After a desired number of summations at summing node 641, a sample is taken from summing node 641 by sharing the charge at the summing node with the output node 653. Just before the sample is taken, output node 653 is precharged to the rail voltage VDD through preset transistor 655 by a short pulse applied at preset node 658. The signal applied at preset node 658 is shown as 705 in FIG. 7. The sample is taken by switching the charge transfer transistors 651 and 652 on for an appropriate sample period of time by the appropriate signals (sample pulses) at nodes 656 and 657, respectively. It is noted from FIG. 7 that the signal 706 applied at node 656 is the complement of the signal 707 applied at node 657.

Figure 7A:
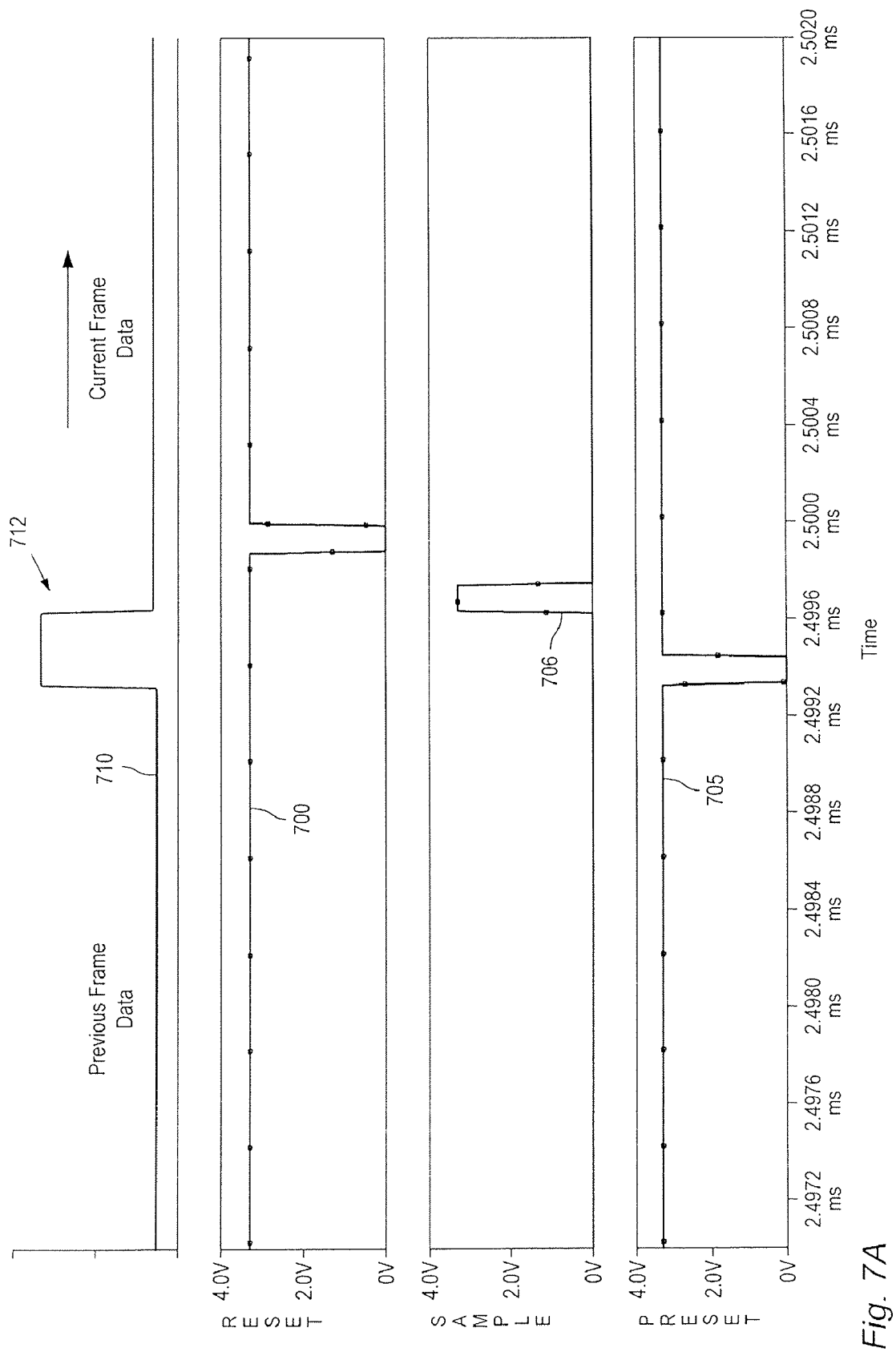
FIG. 7A is a timing chart on a somewhat smaller time scale as compared to FIG. 7, showing certain end of frame signals used by the ROIC unit cell shown in FIG. 6, and also showing an example waveform at the output of the ROIC unit cell.

FIG. 7A shows the preset signal 705, sample signal 706, and reset signal 700 at the end of a given frame on a somewhat shorter time scale as compared to FIG. 7 in order to better show the timing of the signals at the end of frame. FIG. 7A also shows an exemplary output node signal 710. It will be noted that because the capacitance of output capacitor 654 in FIG. 6 and the parasitic capacitance exhibited by the output arrangement 670 is small compared to the capacitance at summing node 641, the analog remembered voltage at output node 653 is very close in voltage to the voltage from summing node 641. Thus the output node signal 710 in FIG. 7A, that is, the signal at the output node 653 in FIG. 6, comprises a voltage signal indicative of the radiant power absorbed by detector 601 and thus represents a data signal for an imaging system associated with ROIC unit cell 600. The data signal for the current frame comprises the portion of signal 710 to the right of the sample pulse of sample signal 706 in FIG. 7A. It is noted that the portion of output node signal 710 shown in FIG. 7A to the left of the leading edge of the pulse in preset signal 705, that is, prior to the preset pulse, represents the data signal from the preceding frame. The data signal 710 for the current frame will similarly be held until the next occurrence of the pulse in preset signal 705 which will again erase the data signal by precharging output node 653 in FIG. 6 to VDD in preparation for the next data signal transferred from summing node 641. This presetting of the voltage at output node 653 in FIG. 6 is shown by the portion of signal 710 indicated by reference numeral 712 in FIG. 7A. This precharge indicated at 712 in FIG. 7A begins at the leading edge of the pulse in preset signal 705 and ends at the leading edge of the pulse in sample signal 706.

It will be apparent from FIG. 7 that the repetition rate of the reset signal 700 is equal to the frame rate, as is the repetition rate of the preset signal 705 and the sample signals 706 and 707. In the example of FIG. 7, this repetition and frame rate is 400 Hertz. However, the invention is not limited to any particular frame rate. The frequency of the carrier wave signal 702 and corresponding frequency of the demodulating signal 703 is selected to provide an appropriate number of summations at summing node 641 in FIG. 6 for each frame. Although the carrier wave signal 702 and demodulating signal 703 are shown in FIG. 7 as having a 20 kiloHertz frequency to produce fifty summations for the 400 Hertz frame, any suitable carrier wave frequency may be used within the scope of the invention. The carrier wave frequency is related to the capacitance needed in the ROIC. As carrier wave frequency decreases, the capacitance required increases. On the other hand, as the carrier wave frequency decreases, the number of summations per frame decreases. The 20 kiloHertz carrier wave frequency selected in the example for the 400 Hertz frame rate provides 240 lines of data signals per frame with ten blanking lines at the end of the frame. The ten blanking lines are convenient for providing time to update the data controlling the capacitance adjustment arrangement 610 shown in FIG. 6 as will be discussed further below.

It should be noted that the various signals representing input or control signals to the ROIC unit cell 600 shown in FIG. 6 may be produced in any suitable manner. Since the signals may be generated and delivered to the various ROIC unit cells of the array in any suitable manner, a signal generation arrangement is shown only in block form at 680 in FIG. 6 with only the AC bias generating circuit shown generically at 681 within the block. Also, although shown conceptually in FIG. 6 as a single block 680, it will be appreciated that numerous different circuits may be included in signal generation arrangement to generate the signals required at nodes 637, 639, 644, 656, 657, and 658. Also, the various circuits used to generate the required signals may be thought of as separate elements and need not be combined in a single unit as implied by block 680. Furthermore, one or all of the required signals may be generated off plane, that is, by one or more separate integrated circuits. It will be noted also that the example of FIG. 1 omits the signal generation arrangement entirely from the drawing although such a signal generation arrangement is required as well for the alternative embodiment shown in that figure. The following discussion represents merely examples for generating the signals required by a ROIC unit cell according to the present invention.

The carrier wave signal 702 in FIG. 7 may be generated by a low impedance (less than 4 ohms) analog active filter with a precise square wave input that is derivative of the sample clock. One preferred example filter for generating the sine wave input preferably used in ROIC unit cell 600 will be described below in connection with FIG. 13. Reset signal 700 may be generated on the integrated circuit making up the ROIC array by a shift register and may be delivered to every ROIC unit cell in the array through a group of buffer gates. The demodulator signal 703 has the same frequency as the carrier wave and is preferably delayed to match the minima of the maximum input power phase shift occasioned by the detector resistance. This demodulator signal is preferably one sample wide, that is, it has the same width as the sample pulse shown in FIG. 7A at signal 706, and may be generated from the sample clock signal for the ROIC using a shift register. Alternatively the demodulator signal 703 may be generated from the sample clock signal for the ROIC using a decode counter and an AND gate. The sample pulse shown at signal 706 in FIG. 7 (applied to node 656 in FIG. 6) may be generated in the integrated circuit making up the ROIC with a shift register and may be delivered to every ROIC unit cell by a group of buffer gates. The sample pulse shown at signal 707 in FIG. 7 (applied to node 657 in FIG. 6) is the complement of the signal 706 and may be generated accordingly. The preset pulse shown at signal 705 in FIG. 7 (applied at present node 658 in FIG. 6) may also be generated on plane using a shift register and sample clock signal for the ROIC, and may then be delivered to every RIOC unit cell in the array through a group of buffer gates. It should be noted again that although the signals are all described in this paragraph as being generated on plane, that is, within the integrated circuit making up the ROIC array, it is possible for any of the input signals (particularly signals 700, 705, 706, and 707) to be generated in a device separate from the integrated circuit making up the ROIC array, as will be appreciated by those skilled in the art.

Output arrangement 670 for ROIC unit cell 600 shown in FIG. 6 includes a cell buffer 671 together with a switching and output amplifier arrangement. The switching and output amplifier arrangement includes a line selection switch 672 preferably associated with an entire line of ROIC unit cells in the array, a column selection switch 673 which is preferably associated with an entire column of ROIC cells in the array, and a respective output buffer amplifier 674 for each column of the array. Typically, a line of ROIC unit cells in the array is horizontal with respect to the image to be produced, while the columns are vertical. Cell buffer 671 is a unity gain voltage amplifier that isolates the charge of output storage capacitor 654 in ROIC unit cell 600 from the line and column bus capacitances associated with line and column selection switches 672 and 673. The line and column selection switches 672 and 673 make up a time division multiplexing arrangement that sequentially transfers the data collected by the various ROIC unit cells of the array to additional circuitry for further processing to produce the desired video image. In one preferred method of operation, a single line switch of the ROIC array is activated to select a given line of the array. The column switches for the array then operate at a sample rate, so that each column switch of the selected line conducts for a suitable sample transfer time until the analog data held at output node of the respective ROIC unit cell, output node 653 in FIG. 6, has been transmitted to the respective output buffer amplifier 674 for the given column. The cell buffer 671 and the output amplifier 674 may each be as simple as a common drain amplifier or as complex as a multistage amplifier depending on the design requirement for the ROIC.

Although the capacitance adjustment arrangement 610 shown in FIG. 6 is illustrated somewhat differently than the corresponding capacitance adjustment arrangements 102a and 116a in FIG. 1, the function provided by capacitance adjustment arrangement 610 is identical to the combined function of the capacitance adjustment arrangements 102a and 116a shown in FIG. 1. Namely, the structure includes additional capacitance that may be selectively added in parallel to the input capacitor 604 in FIG. 6, and also additional capacitance that may be selectively added in parallel to the summing capacitor 643. As discussed above, the ability to adjust the capacitance seen at input node 603 allows for each ROIC unit cell 600 to be adjusted to compensate for the nonuniformity of dark resistance exhibited by the detectors 601 across the array, that is, the nonuniformity of resistance exhibited by the detector in the absence of any absorbed radiant energy. The ability to adjust the capacitance seen at summing node 641 allows each ROIC unit cell 600 to be adjusted to compensate for any nonuniformity in the response to radiant energy absorbed by the respective detector.

One preferred method for setting the capacitance adjustment arrangement 610 to correct for dark resistance nonuniformity between the various detectors 601 includes first measuring the dark resistance of each detector 601 in the array. Each ROIC unit cell preferably includes a test port for facilitating this measurement of dark resistance. The mean dark resistance for the array of detectors is then calculated and a convenient nominal capacitance is selected to identify a target time constant with the mean dark resistance. For each ROIC unit cell 600, the method next includes employing the measured dark resistance of the detector 601 for that cell together with the target time constant to calculate the actual capacitance required for the respective ROIC unit cell. The bits in the memory of the capacitance adjustment arrangement 610 for each ROIC unit cell 600 are then set to provide a capacitance seen at the respective input node 603 that approximates the calculated capacitance for the respective ROIC unit cell. The result of this process is that the time constant for the respective detector 601 and the capacitance seen at the respective input node 603 is made approximately uniform over the entire ROIC array, and this uniformity effectively corrects for the nonuniform dark resistance exhibited by the various detectors 601 in the array.

In preferred forms of the present invention, the calculations described above for setting the bits of each capacitance adjustment arrangement 610 in a given ROIC array may be performed once for the ROIC array and not changed in the normal operation of the ROIC array. To the extent that the dark resistance exhibited by the detectors 601 in the array may change over time for some reason, in response to thermal changes in the array for example, the process may be repeated to change the memory settings as necessary to improve uniformity. The processing capability for performing the method for setting the memory for the capacitance adjustment arrangement 610 for each ROIC unit cell 600 in the array is preferably implemented off plane in a separate dark resistance correction processing device, either a general purpose processor programmed to perform the memory setting process or a special purpose processor.

The bits in each capacitance adjustment arrangement 610 configured to adjust the capacitance seen at summing node 641 may be set in a process similar to that described above for providing the dark resistance nonuniformity correction. However, in this case the goal is to adjust the capacitance seen at summing node 641 such that the summation is approximately uniform between ROIC unit cells 600 for a given photonic input to each detector 601. As with the dark resistance correction, the photo response correction provided through capacitance adjustment arrangement 610 may be performed once for a given ROIC array and then changed only to the extent necessary to correct for variations in photo response that may occur over the course of operation of the ROIC array. A photo response correction processing arrangement may be included in the imaging system utilizing the ROIC array to periodically perform the photo response nonuniformity correction and then reset the appropriate bits of each capacitance adjustment arrangement 610 in the ROIC array.

It will be appreciated that although the dark resistance nonuniformity correction and the photo response nonuniformity correction is described above with reference to the ROIC unit cell embodiment shown in FIG. 6, the same processes may be applied in the alternate ROIC unit cell embodiment shown in FIG. 1.

Figure 8:
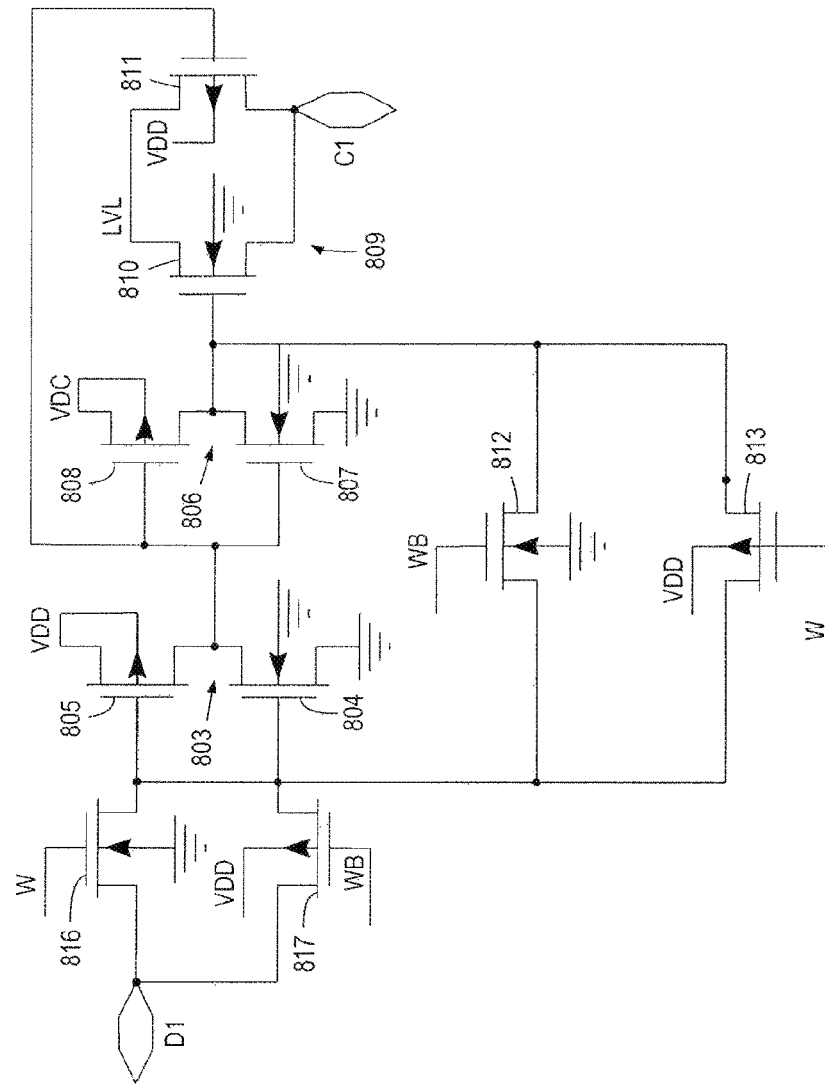
FIG. 8 is a schematic drawing of a memory element that may be used in the capacitance adjustment arrangement shown in FIG. 6.

FIG. 8 illustrates a single bit of the random access memory 621 shown in FIG. 6 and used to control the capacitance seen at either input node 603 or summing node 641 in FIG. 6. The particular bit shown in FIG. 8 for purposes of example is connected to selectively apply the capacitance of capacitor 611 in FIG. 6 to input node 603 through output LVL of memory 621. The circuit comprises a data flip flop circuit including a first inverter 803 made up of transistors 804 and 805, and a second inverter 806 made up of transistors 807 and 808. Each inverter 803 and 806 drives one half of a bi-directional analog gate 809 made up of transistors 810 and 811. Writing is done by removing the regenerative feedback provided by transistors 812 and 813 while providing input data through transistors 816 and 817. This is accomplished by raising the write bus W to the supply voltage while lowering the write not bus WB to ground potential. Data memory is held by parasitic capacitance as the switches are returned to the data read state in which the write bus signal at W is held at ground potential and write not bus WB is held at the supply voltage. It will be appreciated that the identical arrangement is included in memory 621 for each adjustment capacitor included in the system, with the only difference being the node to which the respective analog gate 809 is connected, either input node 603 or summing node 641.

Data may be written to the memory cells in memory 621 at any appropriate time during the operation of ROIC unit cell 600. In particular, data may be written to memory 621 during a start up period for the ROIC array. Also, a portion of each frame preferably includes a number of blanking lines which result in a time period in each frame during which no data is read from the ROIC unit cells 600 making up the array. This blanking time may be used to update memory 621 and correct the nonuniformity adjustments provided by capacitance adjustment arrangement 610 in FIG. 6. The correction of the capacitance adjustments over time need only keep pace with environmental variations that may affect the nonuniformity exhibited by the detectors 601.

Those skilled in the art will appreciate that although 10 bits of memory are shown for memory circuit 621, with 8 bits of memory dedicated to adjusting the capacitance seen at input node 603 in FIG. 6 and 2 bits of memory dedicated to adjusting the capacitance seen at summing node 641, the invention is not limited to any particular size of memory or type of memory. More or fewer bits could be employed for selecting capacitors to connect to input node 603 in FIG. 6 and more or fewer bits could be employed for selecting capacitors to connect to summing node 641. The level of adjustment capacitance available through capacitance adjustment arrangement 610 for input node 603 will be dependent upon the range of dark resistance nonuniformity expected across the detector 601 in the array. Similarly, the level of adjustment capacitance available through capacitance adjustment arrangement 610 for summing node 641 will be dependent upon the range of response nonuniformity expected across the detectors 601 in the array. In some cases it may be possible to dispense with any capacitance adjustment for summing node 641, and use all capacitance available through capacitance adjustment arrangement 610 to adjust for dark resistance nonuniformity in the detectors 601.

Figure 9:
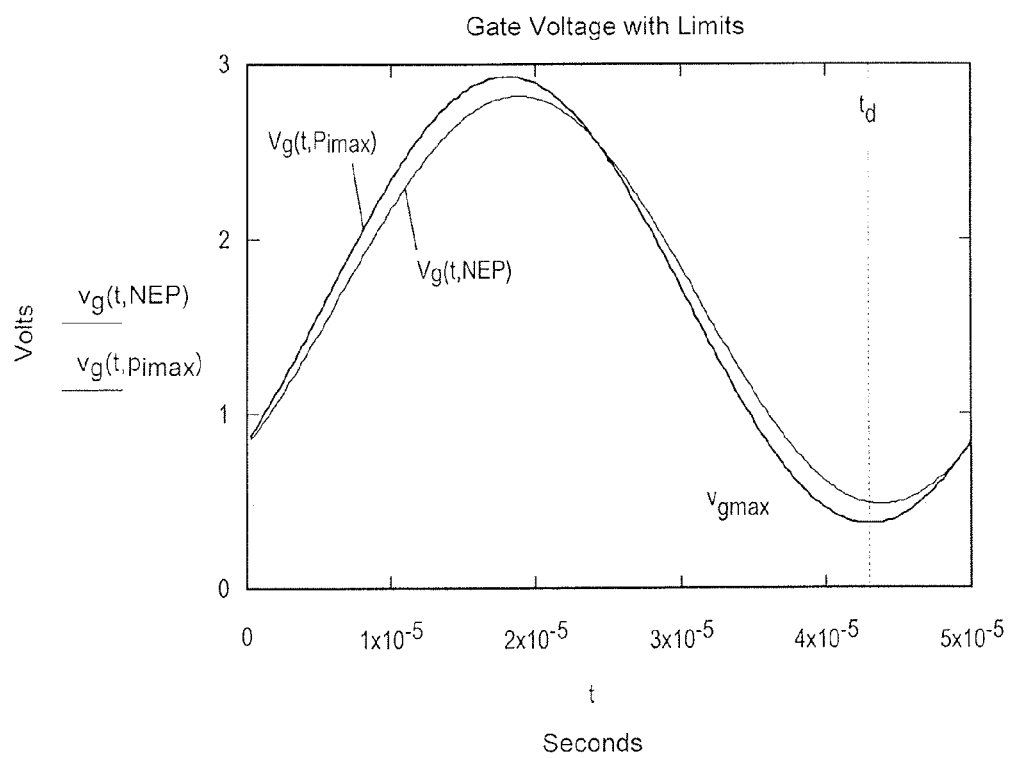
FIG. 9 is a graph showing the variation of the input voltage of the charge transfer amplifier of FIG. 6 as function of time, where the radiant input power absorbed by the photoconductor is stepped from minimum to maximum.

FIG. 9 shows the maximum gate voltage applied to charge transfer input transistor 635 (FIG. 6) as being captured at the demodulator sampling instant $t_d$ which is phase shifted to the minima that corresponds to a desired dynamic range of the ROIC unit cell 600 (FIG. 6). This places the nominal gate voltage maxima earlier than the minima of the phase shift that corresponds to the maximum dark resistance where there is no radiant power being absorbed by the detector 601. As the resistance changes both the phase and the amplitude shift, which improve detection without increasing noise.

The key amplifier parts of charge transfer amplifier 630 should be made relatively large. Matching of minimum area parts for most parameters is about five percent for minimum area parts. Match improves as the square root of the area. Transistors 635 and 638 of charge transfer amplifier 630 should be at least twenty-five times minimum area so that their match to their counterpart transistors in other ROIC unit cells is close to one percent. This ensures that the charge transfer amplifiers 630 will be well matched across the ROIC array. Another benefit of larger area parts is a reduction in low frequency noise. This also drops in accordance with the square root of the area.

Figure 10:
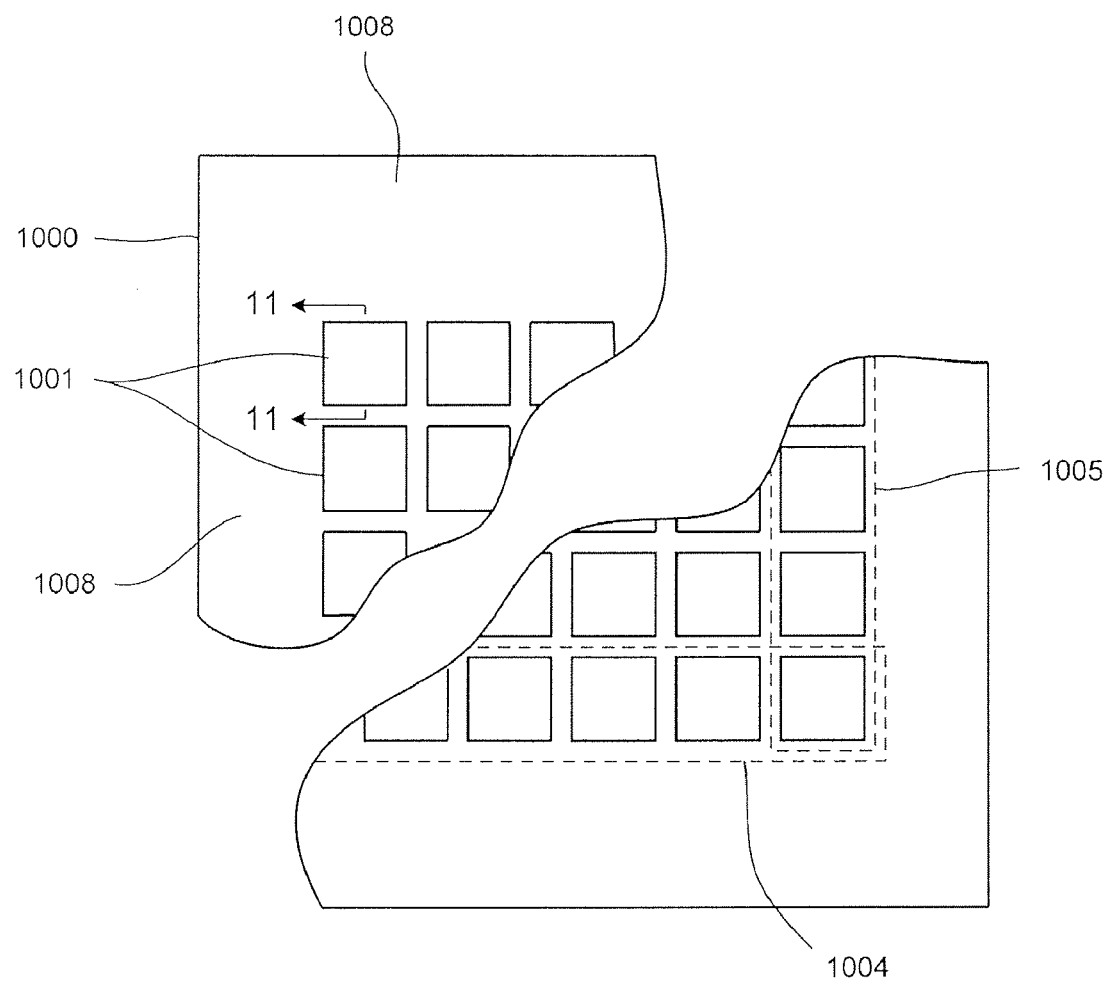
FIG. 10 is a diagrammatic representation of a photoconductor array according to the present invention.
Figure 11:
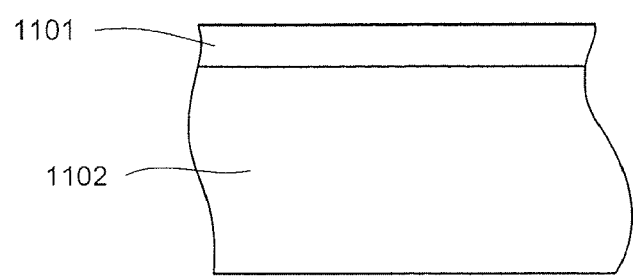
FIG. 11 is a diagrammatic view in section along line 11-11 in FIG. 10.

FIGS. 10 and 11 may be used to describe an example ROIC 1000 made up of an array of ROIC unit cells 1001. Each ROIC unit cell 1001 comprises a unit cell such as ROIC unit cell 10 shown in FIG. 1 or 600 shown in FIG. 6. As shown in FIG. 10, ROIC 1000 includes a number of lines 1004 of ROIC unit cells 1001 that typically correspond to a line of data for a single horizontal line of video image to be produced. ROIC unit cells 1001 are also arranged in a number of columns 1005. The invention is not limited to any particular array size. Various standard array sizes may be used for different imaging applications. The integrated circuit chip comprising ROIC 1000 may include peripheral areas 1008 for circuitry other than the ROIC unit cells themselves. For example, peripheral areas 1008 of ROIC 1000 may be used to provide the multiplexer circuit for transferring data signals from ROIC unit cells 1001, input signal generating and distributing circuitry for signals used by the ROIC unit cells 1001, and for any other circuitry that may be required or desirable. The diagrammatic section view of FIG. 11 shows that for each ROIC unit cell 1001, the material 1101 making up the photoconductor is located over the integrated circuit substrate 1102 on which the ROIC circuit components are fabricated. Any suitable electrical interface may be used to make the required electrical connections between the photoconductor material 1101 and the electrical components formed on substrate 1102. For example, the photoconductor material 1101 may be formed on a quartz substrate (not shown separately in FIGS. 10 and 11) and indium bump bonds (also not shown) may be employed to connect the photoconductor material to the substrate 1102. It will be appreciated that the present invention is not limited to any particular arrangement or technique for placing the photoconductor material 1101 in relation to the circuit substrate 1102 and providing the required electrical connections.

Figure 12:
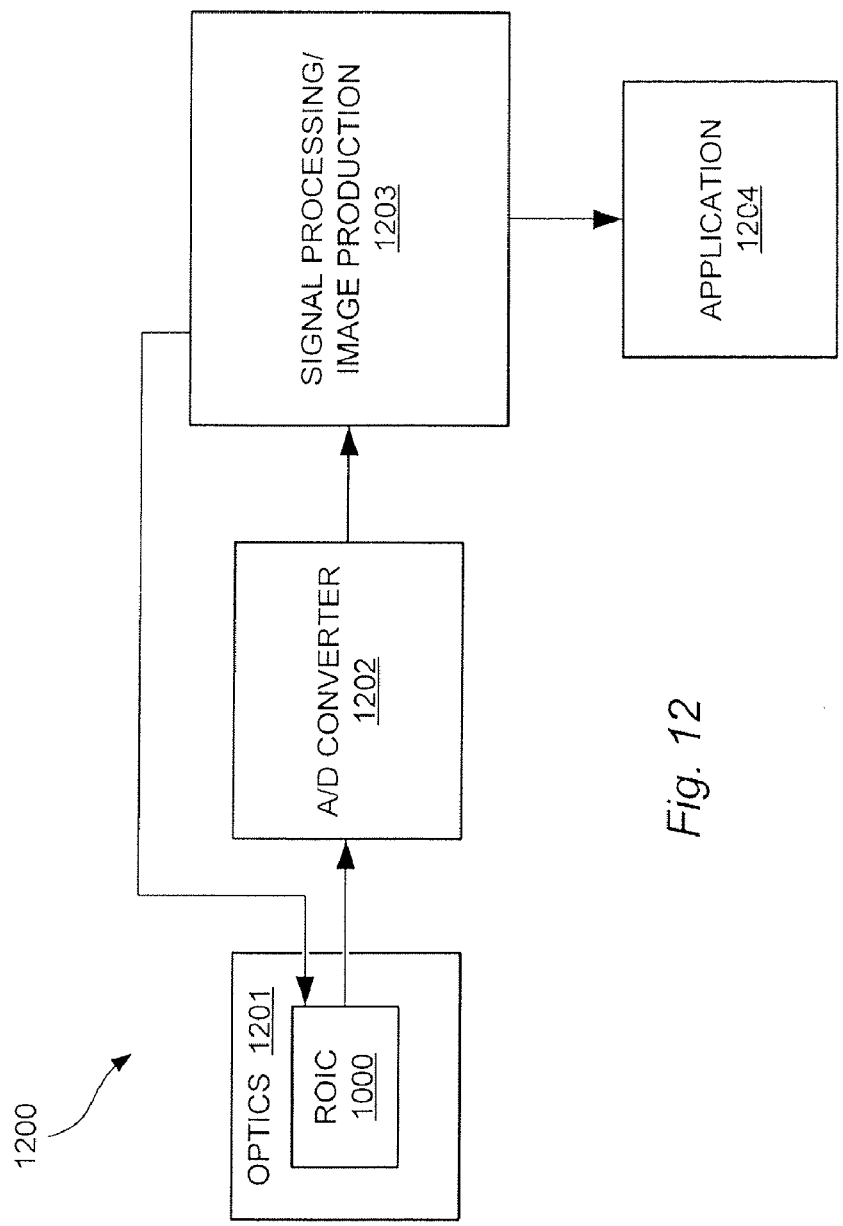
FIG. 12 is a diagrammatic representation of a high speed imaging system employing ROICs according to the present invention.

FIG. 12 provides a high level schematic representation of an imaging system 1200 in which one or more ROICs 1000 according to the present invention may be employed. Imaging system 1200 includes an optical system 1201 for focusing incident light on the plane of the detectors for a particular ROIC 1000. ROIC 1000 is shown in FIG. 12 as transferring its analog data to an analog to digital converter 1202. Digital data is transferred from analog to digital converter 1202 to a signal processor 1203 which uses the digitized data signals from ROIC 1000 to produce a desired image. The image or information from the image may then be made available for use in any suitable application performed by device 1204. It will be noted that FIG. 12 shows a return path for communications from the signal processor 1203 to the ROIC 1000. This return path represents a path for controlling the capacitance adjustment arrangement (610 in FIG. 6) for each ROIC unit cell included in the ROIC 1000. Signal processor 1203 may include the capacity to perform the above described nonuniformity corrections to set the memory of each capacitance adjustment arrangement included in ROIC 1000, or one or more separate processing devices may be included in the system to implement the above-described dark resistance correction and photo response correction.

Figure 13:
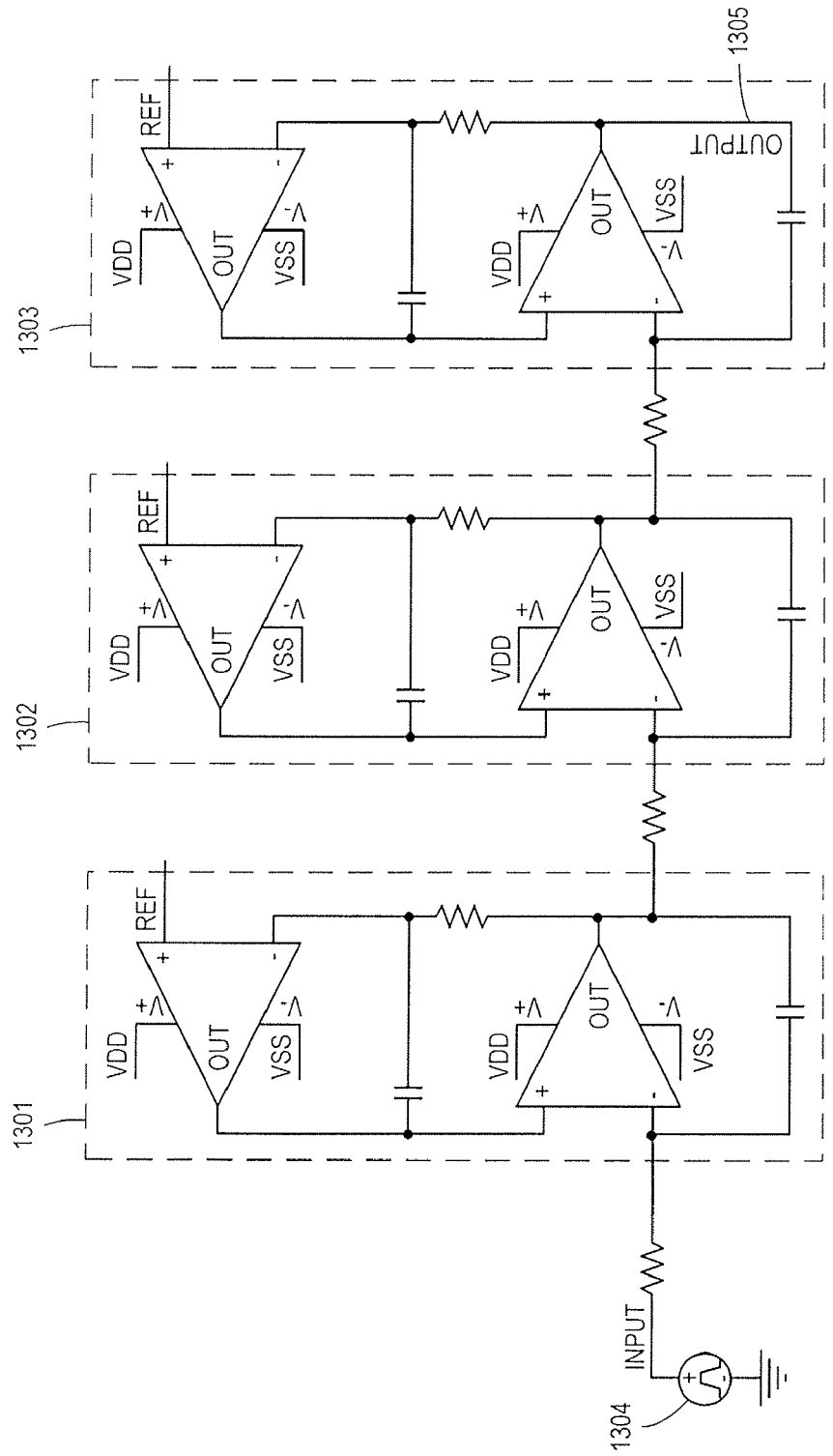
FIG. 13 is an electrical schematic diagram showing one preferred circuit for generating the sine-wave AC biasing signal used by the ROIC unit cell shown in FIG. 6.

FIG. 13 illustrates one preferred biasing signal generator circuit 1300 for generating the desired AC sine wave voltage signal used to bias the detector 601 in the ROIC unit cell 600 shown in FIG. 6. Circuit 1300 comprises a bandpass filter made up of a cascade of three double integrator, bi-quadratic bandpass filters 1301, 1302, and 1303. The input signal at input 11 node 1304 comprises a rectangular wave from a digital clock generator. The output of circuit 1300 is taken at output node 1305 which provides the desired AC sine wave bias signal after an amplitude run up period lasting a few cycles after the circuit is powered up. It will be noted that the non-inverting terminal of the feedback integrator of each of the bandpass filters 1301, 1302, and 1303 may receive a voltage signal labeled "REF" to center the output waveform of circuit 1300 at any desired bias. It should also be noted that a square to sine wave conversion circuit such as circuit 1300 in FIG. 13 is not required in the embodiment of FIG. 1 since that embodiment uses a square AC biasing signal.

The alternating current biasing arrangement employed according to the present invention significantly reduces low frequency noise, power dissipation, and enables a sense (input) capacitor to be used to match to each detector resistance to form a time constant. Digitally controlled capacitor adjustments can be used to match each detector in the detector array so every channel of data for the array has very close to the same time constant. The radiant power absorbed by the detector then modulates the detector resistance, which in turn changes both the phase and amplitude response of each detector in accordance with the impinging radiation. The charge transfer amplifier in the ROIC according to the present invention improves dynamic range because of its logarithmic transfer characteristic.

Figure 14:
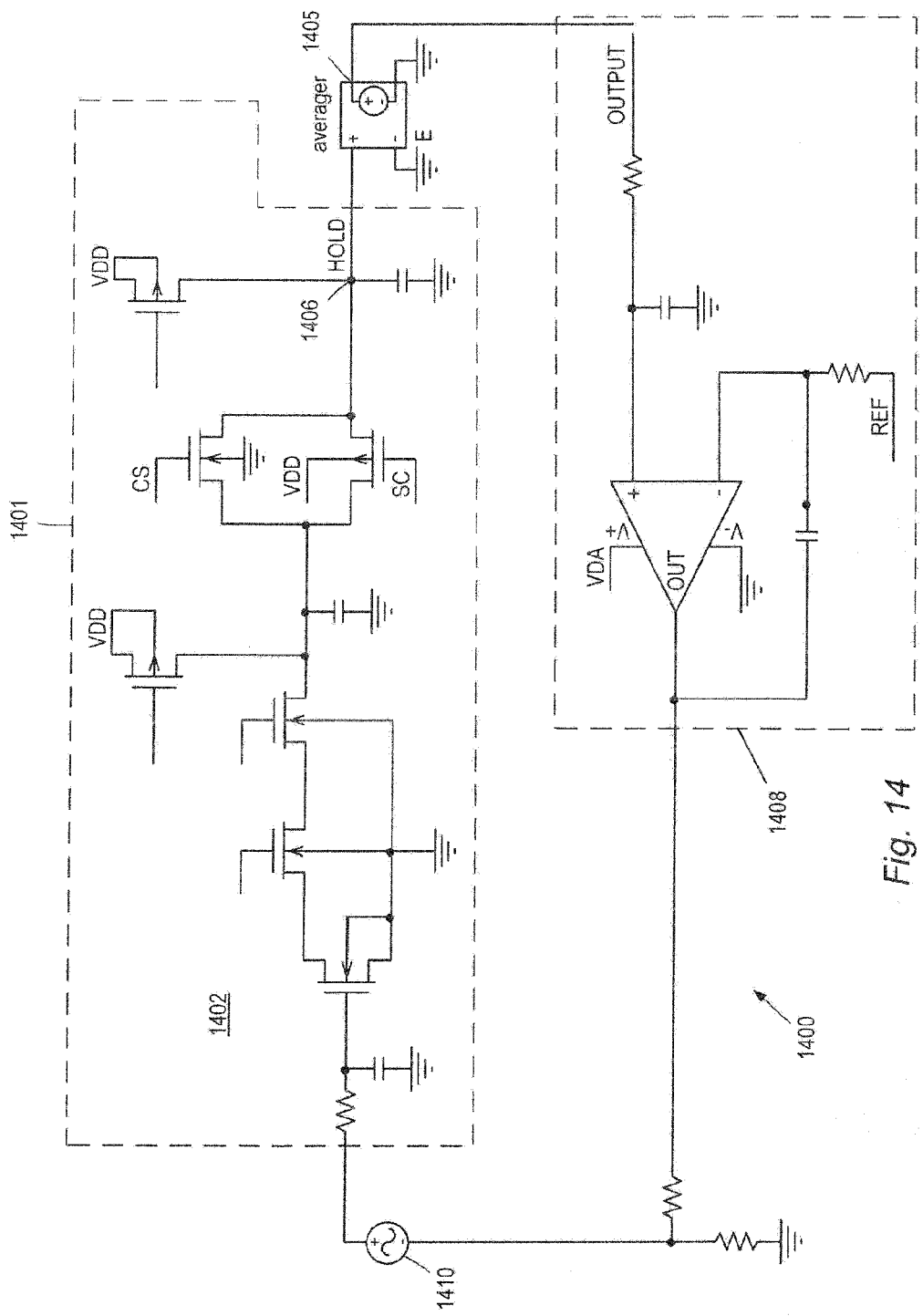
FIG. 14 is an electrical schematic diagram showing a blind detector DC bias thermal compensation arrangement that may be employed with an ROIC array embodying the principles of the invention.

FIG. 14 shows an example of a thermal compensation loop 1400 that can be used for reducing noise in an ROIC according to the invention arising from thermal conditions of the various detectors included in the detector array. The illustrated thermal compensation loop 1400 is helpful to compensate for temperature variations in the detectors of the detector array, and particularly the slowly varying pattern noise occasioned by a thermoelectric cooling arrangement that may be used to cool the ROIC and detector array.

Thermal compensation loop 1400 comprises a feedback loop that utilizes blind ROIC unit cells such as the single illustrated cell 1401. Preferably, thermal compensation loop 1400 utilizes at least blind ROIC unit cells at the corners of an extra line in the array, or an entire extra line of blind ROIC unit cells. Each blind RIOC unit cell, such as illustrated cell 1401, comprises an ROIC unit cell in the array which is made optically blind so that the detector 1402 included in the respective unit cell does not respond to incident photonic energy. This may be accomplished by applying a suitable optical shielding material over the detector material for the cell to block the desired wavelengths of light. It will be appreciated that even though the blind ROIC unit cell does not respond to incident photonic energy, the detector 1402 still responds to temperature variations. Furthermore, the thermal variation in the ROIC array will typically be uniform across the various detectors in the array, and thus the thermal variation seen by the detector of a given blind ROIC unit cell (such as the illustrated cell 1401) will approximate the variation seen by all detectors in the array.

Circuit 1400 also includes an averager 1405 that receives the signal at the output node 1406 of each blind unit cell 1401. The averaged signal output from averager 1405 provides an input to an integrator 1408, whose output is connected back in to the wave form generator 1410 for the ROIC array. The output of integrator 1408 provides a direct current feedback which adds to the carrier wave to compensate for the thermal response of the ROIC unit cells included in the array.

As used herein, whether in the above description or the following claims, the terms "comprising," "including," "carrying," "having," "containing," "involving," and the like are to be understood to be open-ended, that is, to mean including but not limited to. Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described preferred embodiments are intended to illustrate the principles of the invention, but not to limit the scope of the invention. Various other embodiments and modifications to these preferred embodiments may be made by those skilled in the art without departing from the scope of the present invention.

The invention claimed is:

1. A read out circuit for generating an output signal indicative of the photonic energy absorbed by a photoconductor, the read out circuit including:
   (a) a biasing signal generator connected to apply an alternating current biasing signal to a first terminal of the photoconductor;
   (b) an input capacitor connected between a second terminal of the photoconductor and an input reference voltage, the connection between the second terminal of the photoconductor and the input capacitor defining an input node;
(c) a charge transfer amplifier having an input connected to the input node and an output connected to a summing node, the charge transfer amplifier further including a demodulating transistor connected to receive a demodulating signal;
(d) a charge collection circuit including a reset transistor connected to selectively couple the summing node to a supply voltage, and further including a summing capacitor connected to the summing node to store charge applied to the summing node; and
(e) a sampling circuit including (i) a charge transfer arrangement connected between the summing node and an output node to selectively apply a charge from the summing node to the output node, (ii) a preset transistor connected to selectively couple the output node to the supply voltage, and (iii) an output capacitor connected to the output node to store charge applied to the output node.

2. The read out circuit of claim 1 further including:
(a) one or more input adjustment capacitors; and
(b) a respective input adjustment transistor for each input adjustment capacitor, the respective input adjustment transistor for a respective one of the input adjustment capacitors being connected in series with that respective input adjustment capacitor so as to selectively connect that respective input adjustment capacitor in parallel with the input capacitor between the second terminal of the photoconductor and the input reference voltage.

3. The read out circuit of claim 2 further including a respective memory cell for each respective input adjustment transistor, the respective memory cell for a respective input adjustment transistor having a cell output connected to the gate of that respective input adjustment transistor.

4. The read out circuit of claim 1 wherein the photoconductor is included in an array of other photoconductors, each other photoconductor in the array including a respective read out circuit connected to receive the alternating current biasing signal at a first terminal of that photoconductor.

5. The read out circuit of claim 1 further including:
(a) one or more summing adjustment capacitors; and
(b) a respective summing adjustment transistor for each summing adjustment capacitor, the respective summing adjustment transistor for a respective one of the summing adjustment capacitors being connected in series with that respective summing adjustment capacitor so as to selectively connect that respective summing adjustment capacitor in parallel with the summing capacitor between the summing node and a summing node reference voltage.

6. The read out integrated circuit of claim 5 further including a respective summing adjustment memory cell for each respective summing adjustment transistor, the respective summing adjustment memory cell for a respective summing adjustment transistor having a cell output connected to the gate of that respective summing adjustment transistor.

7. The read out integrated circuit of claim 1 further including a charge injection suppression transistor having its source-drain conduction path connected between an output of the demodulating transistor and the summing node.

8. A read out circuit for generating an output signal indicative of the photonic energy absorbed by a photoconductor, the read out circuit including:

(a) a biasing signal generator connected to apply an alternating current biasing signal to a first terminal of the photoconductor;
(b) input capacitance means for storing charge applied to a second terminal of the photoconductor;
(c) charge transfer amplifier means for transferring charge to a summing node in response to the charge stored by the input capacitance means and a demodulating signal;
(d) charge collection means for selectively resetting the summing node to a base charge level, and for storing charge applied to the summing node between resets to the base charge level; and
(e) sampling means for (i) selectively applying a charge from the summing node to an output node, for (ii) selectively presetting the output node to a base output charge level, and for (iii) storing charge applied to the output node between presets to the base output charge level.

9. The read out circuit of claim 8 wherein the input capacitance means includes:
(a) an input capacitor connected between the second terminal of the photoconductor and an input reference voltage; and
(b) one or more input adjustment circuits for selectively adding capacitance in parallel with the input capacitor between the second terminal of the photoconductor and the input reference voltage.

10. The read out circuit of claim 9 wherein the each input adjustment circuit includes an input adjustment capacitor connected in series with an input adjustment transistor between the second terminal of the photoconductor and the input reference voltage.

11. The read out circuit of claim 10 further including a respective memory cell for each input adjustment circuit, the respective memory cell having an output connected to the gate of the input adjustment transistor of the respective input adjustment circuit.

12. The read out circuit of claim 8 wherein the charge collection means includes:
(a) a summing capacitor connected between the summing node and a summing reference voltage; and
(b) one or more summing adjustment circuits for selectively adding capacitance in parallel with the summing capacitor between the summing node and the summing reference voltage.

13. The read out circuit of claim 12 wherein the each summing adjustment circuit includes a summing adjustment capacitor connected in series with a summing adjustment transistor between the summing node and the summing reference voltage.

14. The read out circuit of claim 13 further including a respective summing adjustment memory cell for each summing adjustment circuit, the respective summing adjustment memory cell having an output connected to the gate of the summing adjustment transistor of the respective summing adjustment circuit.

15. A method for generating an output signal indicative of the photonic energy absorbed by a photoconductor, the method including:
(a) applying an alternating current biasing signal to a first terminal of the photoconductor and storing a charge at a second terminal of the photoconductor with an input capacitance connected to the second terminal of the photoconductor;
(b) for each of a number of cycles of the alternating current biasing signal, transferring charge to a summing node in response to (i) the charge stored by the input capacitance, and (ii) a demodulating signal;

(c) storing the charge transferred to the summing node, the charge transferred to the summing node being stored with a summing capacitance connected to the summing node;

(d) transferring the charge stored at the summing node, the charge stored at the summing node being transferred to an output node and being stored at the output node with an output capacitance connected to the output node; and (e) isolating the charge at the output node from the summing node, the isolated charge at the output node comprising a data signal representative of the photonic energy absorbed by the photoconductor.

16. The method of claim 15 further including modifying the input capacitance.

17. The method of claim 16 wherein the input capacitance is modified by connecting one or more input adjustment capacitors in parallel with an input capacitor between the second terminal of the photoconductor and an input reference voltage.

18. The method of claim 17 further including controlling the connection of each of the one or more input adjustment capacitors through a respective transistor and memory cell output.

19. The method of claim 15 further including modifying the summing capacitance.

20. The method of claim 19 wherein the summing capacitance is modified by connecting one or more summing adjustment capacitors in parallel with a summing capacitor between the summing node and a summing reference voltage.

* * * * *